(12) United States Patent
Tsujihashi

(10) Patent No.: US 9,818,490 B2
(45) Date of Patent: Nov. 14, 2017

(54) SEMICONDUCTOR DEVICE

(71) Applicant: RENESAS ELECTRONICS CORPORATION, Tokyo (JP)

(72) Inventor: Yoshiki Tsujihashi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/586,761

(22) Filed: May 4, 2017

(65) Prior Publication Data
US 2017/0236596 A1    Aug. 17, 2017

Related U.S. Application Data

(63) Continuation of application No. 14/923,257, filed on Oct. 26, 2015, now Pat. No. 9,672,937.

(30) Foreign Application Priority Data

Oct. 27, 2014   (JP) .................................. 2014-218195

(51) Int. Cl.
| | | |
|---|---|---|
| G11C 17/00 | (2006.01) | |
| G11C 17/12 | (2006.01) | |
| G11C 7/06 | (2006.01) | |
| G11C 29/02 | (2006.01) | |
| G11C 29/38 | (2006.01) | |

(52) U.S. Cl.
CPC ............ *G11C 17/123* (2013.01); *G11C 7/065* (2013.01); *G11C 29/025* (2013.01); *G11C 29/38* (2013.01)

(58) Field of Classification Search
CPC ..... G11C 17/123; G11C 29/025; G11C 29/38; G11C 7/065
See application file for complete search history.

(56) References Cited

U.S. PATENT DOCUMENTS

| | | | |
|---|---|---|---|
| 2007/0002648 | A1 | 1/2007 | Ikeda et al. |
| 2008/0291754 | A1 | 11/2008 | Nakai et al. |
| 2009/0046528 | A1 | 2/2009 | Lee |
| 2010/0103756 | A1* | 4/2010 | Hirota ...................... G11C 7/12 |
| | | | 365/203 |

(Continued)

FOREIGN PATENT DOCUMENTS

JP          1-100797 A    4/1989

OTHER PUBLICATIONS

Non-Final Office Actiion dated Aug. 26, 2016, issued in U.S. Appl. No. 14/923,257.

(Continued)

*Primary Examiner* — Toan Le
(74) *Attorney, Agent, or Firm* — McDermott Will & Emery LLP

(57) ABSTRACT

A semiconductor device includes a word line coupled to a mask ROM memory cell, a bit line pair coupled to the memory cell, a differential sense amplifier for amplifying the potential difference of the bit line pair, and a logic circuit for detecting whether the logic states of the bit line pair match or not. In this way, when there is a failure in the memory cell, it is possible to prevent the semiconductor device from passing the test as a result of the determination that the actual value is the same as the expected value in the test even if there is no potential difference in the bit line pair.

8 Claims, 17 Drawing Sheets

(56) References Cited

U.S. PATENT DOCUMENTS

| | | | |
|---|---|---|---|
| 2010/0142250 A1* | 6/2010 | Kobayashi | G11C 29/48 |
| | | | 365/63 |
| 2010/0309738 A1 | 12/2010 | Na | |
| 2011/0176379 A1 | 7/2011 | Takayama et al. | |
| 2011/0255353 A1 | 10/2011 | Fukushima et al. | |
| 2014/0241076 A1 | 8/2014 | Kwon et al. | |

OTHER PUBLICATIONS

Notice of Allowance dated Feb. 13, 2017, issued in U.S. Appl. No. 14/923,257.

* cited by examiner (NOTE) DASHED LINE IS THE CASE OF OPEN FAILURE BETWEEN FOCUSED CELL AND BIT (NOTE) DASHED LINE IS THE CASE OF OPEN FAILURE BETWEEN FOCUSED CELL AND BIT

SEMICONDUCTOR DEVICE

CROSS-REFERENCE TO RELATED APPLICATIONS

This Application is a Continuation of U.S. application Ser. No. 14/923,257 filed on Oct. 26, 2015, which claims the benefit of the disclosure of Japanese Patent Application No. 2014-218195 filed on Oct. 27, 2014, the disclosures of which are incorporated herein by reference in their entireties.

BACKGROUND

The present invention relates to a semiconductor device, and more particularly, to a semiconductor device including a mask read only memory (ROM).

In Patent Document 1 (Japanese Unexamined Patent Application No. HEI 1(1989)-100797, a memory cell is formed by a pair of different MOS transistors. In this memory cell, the fixed data of logic "1" or "0" is programmed based on which one of the pair of MOS transistors is set to a threshold higher than the other transistor. The pair of MOS transistors is coupled to a pair of bit line. The complementary level of the pair of bit lines is given to a differential sense amplifier through a common data line. The differential sense amplifier detects the level difference of the input signal. Then, the differential sense amplifier amplifies the level difference and outputs to the outside as memory cell data.

SUMMARY

However, there is a variation in the pair caused by the variation of impurities or the like, even though the layout of the circuit is designed to be perfectly symmetrical. For this reason, if there is no potential difference in the bit line pair that is greater than the offset voltage occurring in the differential sense amplifier, this may result the differential sense amplifier making an erroneous determination depending on the state of the finished device. To put it the other way around, even if the bit line pair has the same potential, the differential sense amplifier outputs a value determined based on the positive or negative of the offset voltage.

In other words, when there is a failure in the memory cell (for example, the connection between the memory cell and the bit line is broken), the differential sense amplifier determines that the actual value is the same as the expected value in a series of shipping test of LSI (in particular, the manufacturing defect test of mask ROM) even if there is no potential difference in the bit pair, and as a result, the semiconductor device may pass the test. In such a case, there is a risk of malfunction appearing due to noise or other factors in the market.

These and other objects and advantages will become apparent from the following description of the present specification and the accompanying drawings.

A semiconductor device according to an embodiment of the present invention includes: a plurality of mask ROM memory cells; a first bit line and a second bit line that are coupled to the mask ROM memory cells; a differential sense amplifier for amplifying the potential difference between the first and second bit lines; and a logic circuit for detecting whether the logic state of the first bit line and the logic state of the second bit line match or not.

According to an embodiment of the present invention, when there is a failure in a memory cell, it is possible to prevent the semiconductor device from passing the test as a result of the determination that the actual value is the same as the expected value.

DETAILED DESCRIPTION

Hereinafter, the embodiments of the present invention will be described with reference to the accompanying drawings.

First Embodiment

Figure 1:
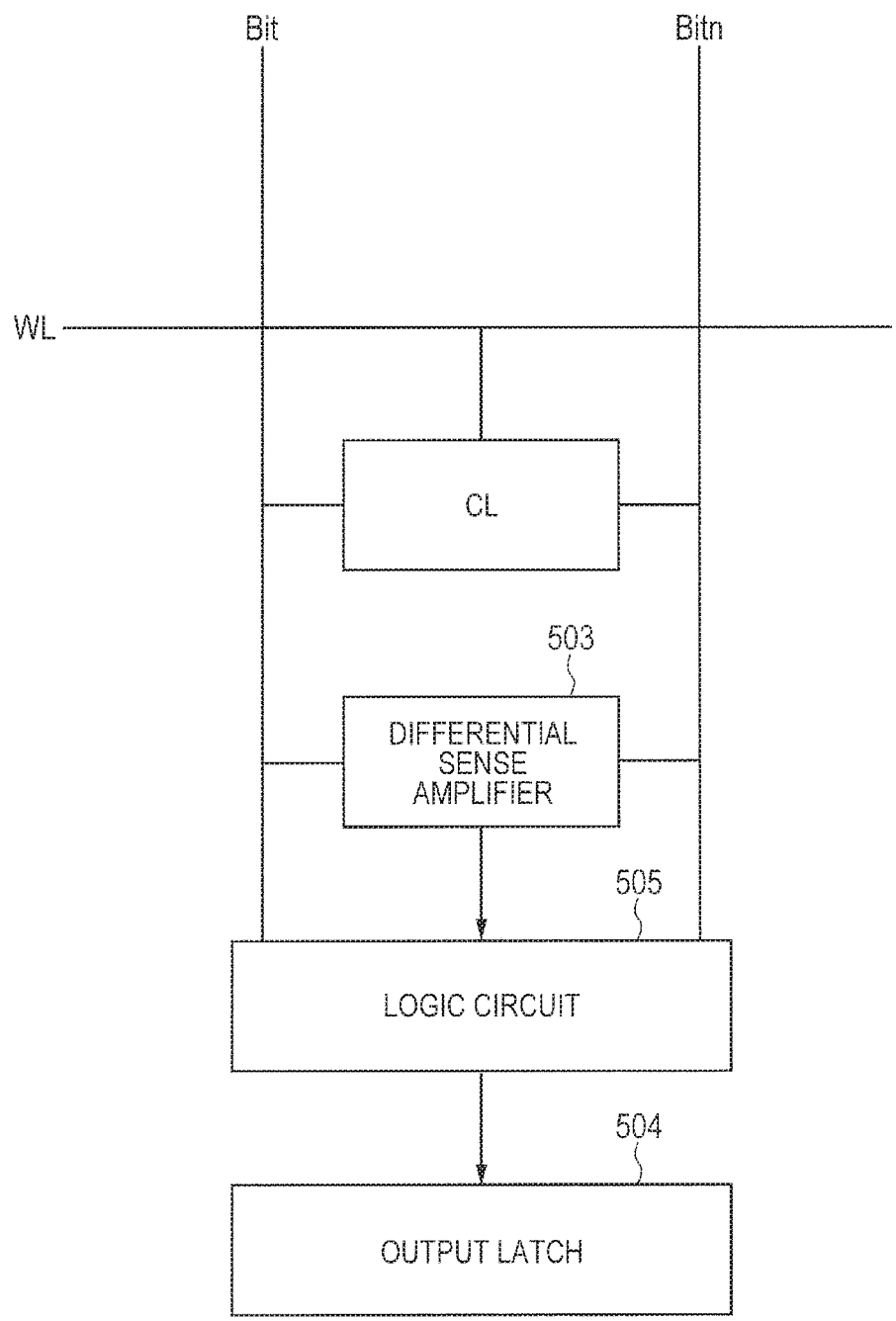
FIG. 1 is a diagram showing the configuration of a semiconductor device according to a first embodiment.

FIG. 1 is a diagram showing the configuration of a semiconductor device according to a first embodiment.

The semiconductor device includes a plurality of mask ROM memory cells CL, a word line WL, a pair of bit lines Bit and Bitn, a differential sense amplifier 503, an output latch 504, and a logic circuit 505.

The word line WL is coupled to the memory cell CL.

The bit line pair Bit, Bitn is coupled to the memory cell CL.

The differential sense amplifier amplifies the potential difference of the bit line pair Bit, Bitn.

The logic circuit 505 is coupled to the bit line pair Bit, Bitn. The logic circuit 505 detects whether the logic states of the bit line pair Bit, Bitn match or not.

The output latch 504 latches the output of the logic circuit 505.

As described above, according to the present embodiment, when there is a failure in the memory cell, the provision of the logic circuit coupled to the bit line pair can prevent the memory cell from passing the test as a result of the determination that the actual value is the same as the expected value.

Second Embodiment

Figure 2:
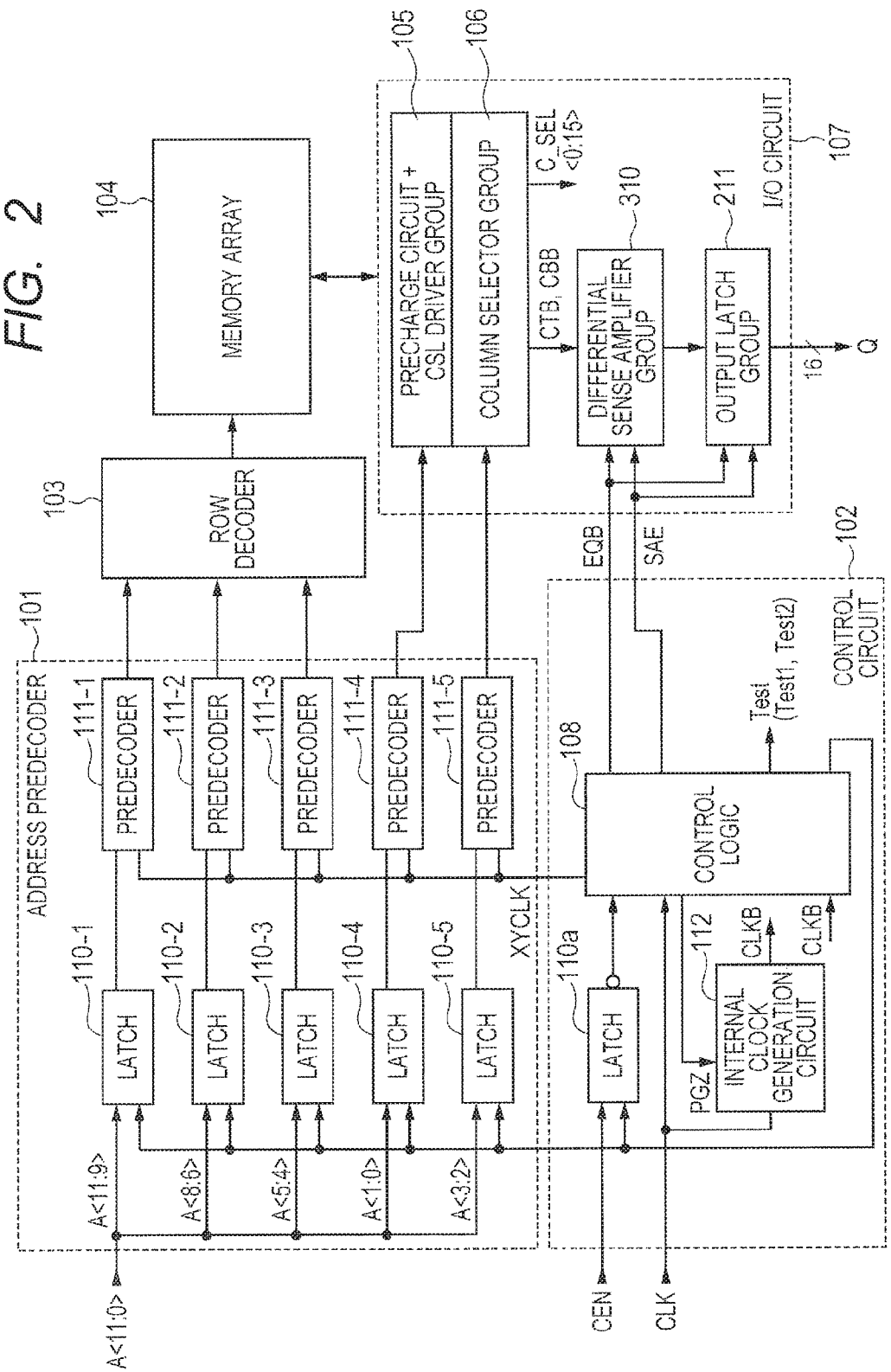
FIG. 2 is a diagram showing the configuration of a semiconductor device according to a second embodiment.

FIG. 2 is a diagram showing the configuration of a semiconductor device according to a second embodiment.

Referring to FIG. 2, the semiconductor device includes an address predecoder 101, a control circuit 102, a row decoder 103, a memory array 104, and an I/O circuit 107.

The address predecoder 101 includes: a plurality of latches 110-1 to 110-5, each holding a different bit of an address signal A; and predecoders 111-1 to 111-5 for decoding the respective bits of the address signal A output from the latches 110-1 to 110-5.

The memory array 104 includes a plurality of mask ROM memory cells arranged in a matrix form.

The row decoder 103 selects one of a plurality of word lines WL in the memory array 104 according to the decode results of the predecoders 111-1 to 111-5. Then, the row decoder 103 activates the selected word line WL.

The control circuit 102 includes a latch 110a, an internal clock generation circuit 112, and a control logic circuit 108.

The latch 110a latches a control signal from the control logic circuit 108 when a clock enable signal CEN is enable.

The internal clock generation circuit 112 generates an internal clock CLKB from an outside clock CLK, and supplies the internal clock CLKB to the control logic circuit 108 and the like.

The control logic circuit 108 controls the operation (test signal level) or the like in the test mode (first mode). Note that the control logic circuit 108 receives a mode switching signal to switch between the test mode and the normal mode, which will be described below. Upon switching to the test mode, the control logic circuit 108 generates internal control signals (Test, (Test1, Test2) and the like).

The I/O circuit 107 includes a precharge circuit+CSL driver group 105, a column selector group 106, a differential sense amplifier group 310, and an output latch group 211.

Figure 3:
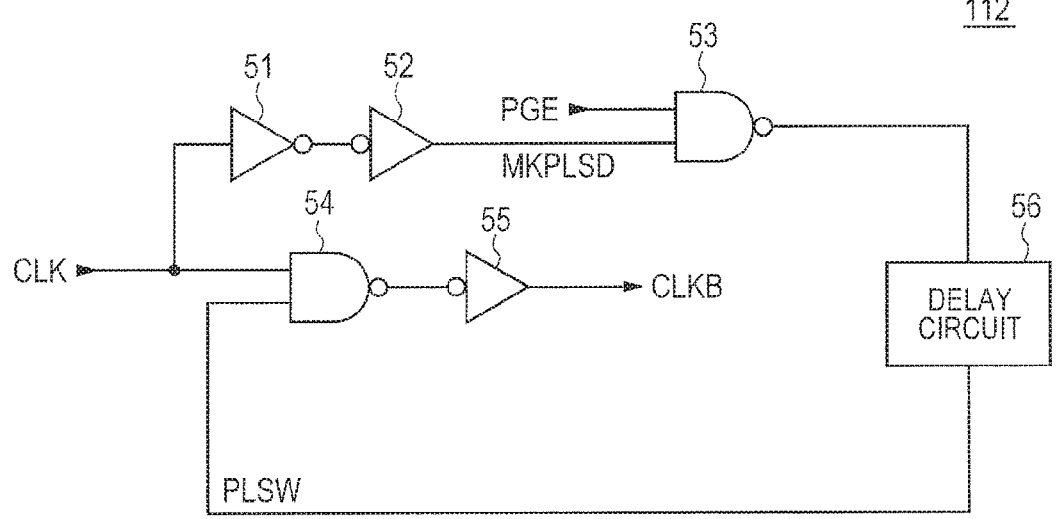
FIG. 3 is a diagram showing the configuration of an internal clock generation circuit.

FIG. 3 is a diagram showing the configuration of the internal clock generation circuit 112.

As shown in FIG. 3, the internal clock generation circuit 112 includes an inverter 51, an inverter 52, an NAND circuit 53, an NAND circuit 54, an inverter 55, and a delay circuit 56.

The inverter 51 receives the outside clock CLK, and outputs a signal obtained by inverting the outside clock CLK.

The inverter 52 receives the output of the inverter 51, and outputs a signal MKPLSD obtained by inverting the output of the inverter 51.

The NAND circuit 53 receives the signal PGE that the control logic circuit 108 generates in response to the mode switching signal from the outside of the mask ROM, as well as the signal MKPLSD. Then, the NAND circuit 53 outputs the NAND of the signals PGE and MKPLSD.

The delay circuit 56 outputs a signal PLSW in response to the output of the NAND circuit 53.

The NAND circuit 54 receives the outside clock CLK as well as the signal PLSW, and outputs the NAND of the outside clock CLK and the signal PLSW.

The inverter 55 receives the output of the NAND circuit 54, and outputs the internal clock CLKB obtained by inverting the output of the NAND circuit 54.

Figure 4:
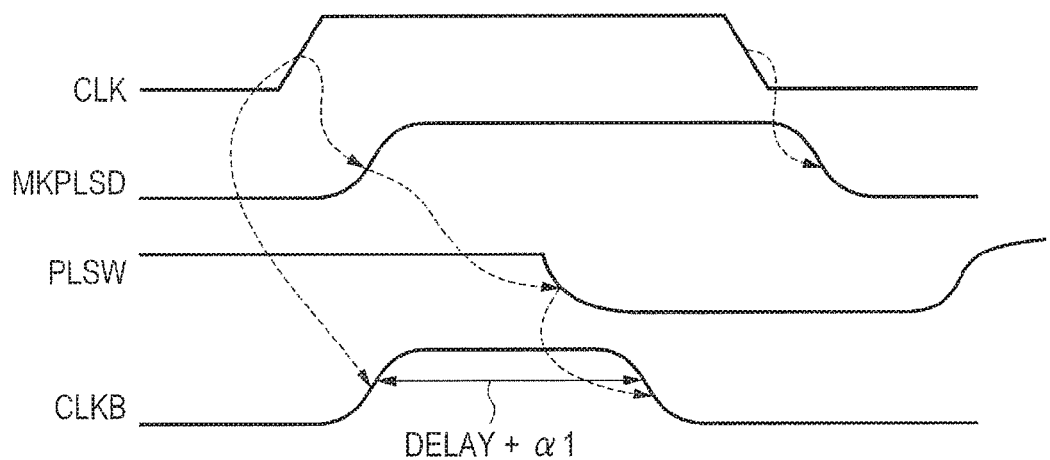
FIG. 4 is a diagram that illustrates the pulse width of an internal clock CLKB generated in the normal mode.

FIG. 4 is a diagram that illustrates the pulse width of the internal clock CLKB generated in the normal mode (second mode). Here, the normal mode is the mode for performing normal operation, and is the mode for testing the state of normal operation in the shipping test.

When the outside clock CLK rises, the internal clock CLKB rises after a delay time ($\alpha 1$) by the NAND circuit 54 and the inverter 55.

On the other hand, when the outside clock CLK rises, the signal MKPLSD rises after a delay time ($\alpha 2$) by the inverters 51 and 52. The level of PGE is "H" in the normal mode, so that the signal PLSW falls after a delay time (DELAY) by the delay circuit 56. Then, the internal clock CLKB falls after the delay time ($\alpha 1$) by the NAND circuit 54 and the inverter 55 from the fall of the signal PLSW.

Thus, the length of the period in which the internal clock CLKB is at the high level is DELAY+$\alpha 1$.

Figure 5:
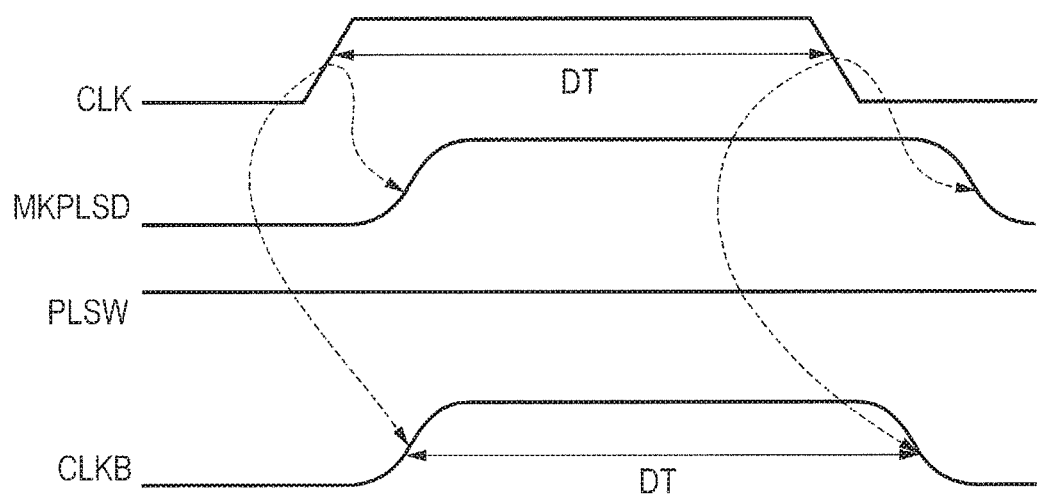
FIG. 5 is a diagram that illustrates the pulse width of the internal clock CLKB generated in the test mode.

FIG. 5 is a diagram that illustrates the pulse width of the internal clock CLKB generated in the test mode.

When the outside clock CLK rises, the internal clock CLKB rises after the delay time ($\alpha 1$) by the NAND circuit 54 and the inverter 55.

On the other hand, when the outside clock CLK rises, the signal MKPLSD rises after the delay time ($\alpha 2$) by the inverters 51 and 52. In the test mode, PGE is at "L" level, so that the signal PLSW maintains "H" level.

When the outside clock CLK rises, the internal clock CLKB rises after the delay time ($\alpha 1$) by the NAND circuit 54 and the inverter 55 because the signal PLSW is at "H" level.

Thus, the period in which the internal clock CLKB is at the high level is the length (DT) of the period in which the outside clock CLK is at "H" level.

Figure 6:
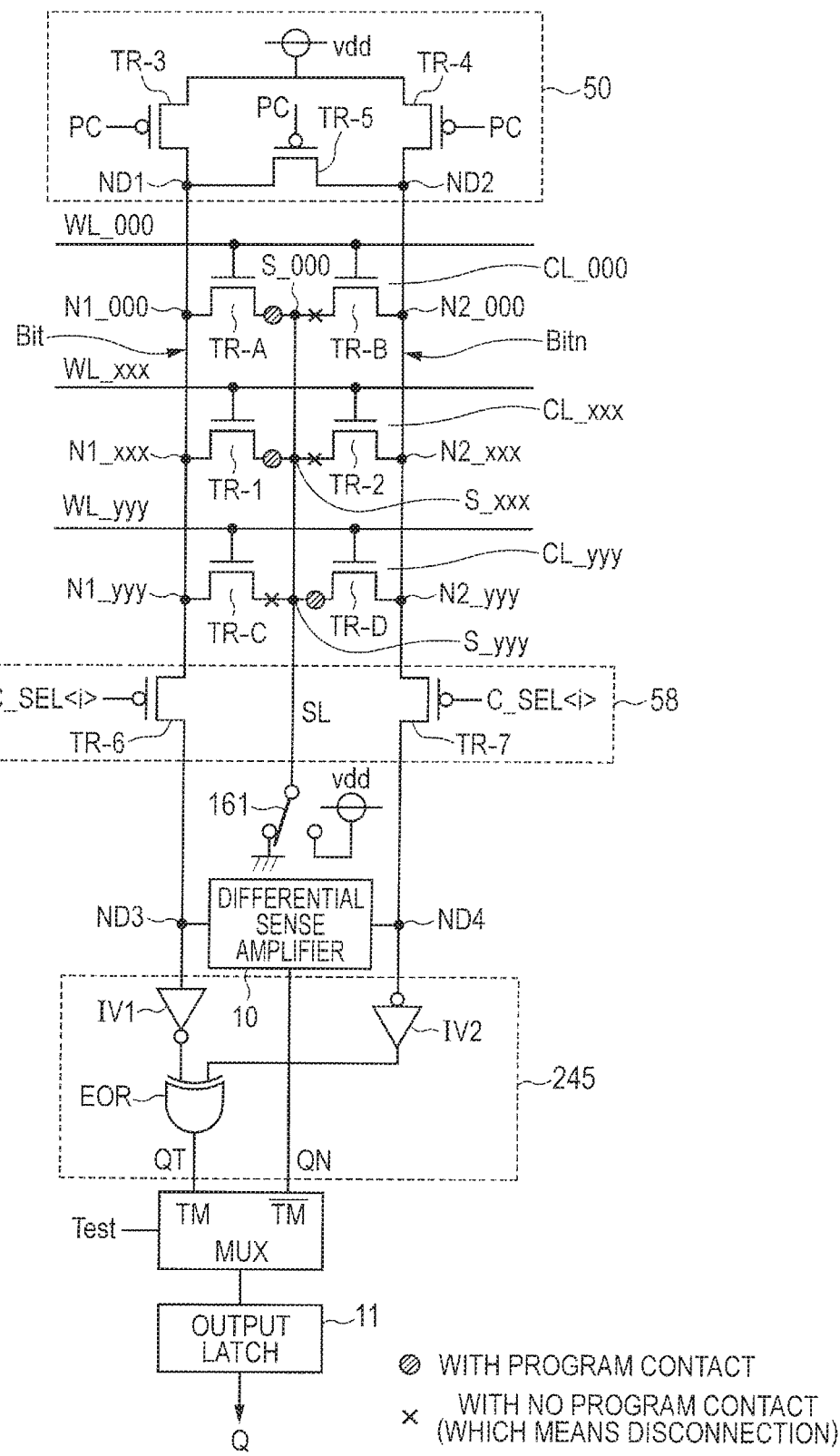
FIG. 6 is a diagram showing a part of the configuration of a memory array and an I/O circuit in the i-th column according to the second embodiment.

FIG. 6 is a diagram showing a part of the configuration of the memory array 104 and the I/O circuit 107 in the i-th column according to the second embodiment.

Referring to FIG. 6, although the i-th column of the memory array 104 includes a plurality of memory cells, the present embodiment shows representative three memory cells CL_000, CL_xxx, and CL_yyy.

The memory array 104 includes word lines WL_000, WL_xxx, and WL_yyy that are coupled to the memory cells CL_000, CL_xxx, and CL_yyy, bit lines Bit and Bitn, a source line SL, and a switch 161.

The switch 161 couples the source line SL to a power supply vdd or ground GND.

The memory cell CL_000 includes N channel MOS transistors TR-A and TR-B. The N channel MOS transistor TR-A is provided between a node N1_000 on the bit line Bit, and a node S_000 on the source SL. The gate of the N channel MOS transistor TR-A is coupled to the word line WL_000. The N channel MOS transistor TR-B is provided between a node N2_000 on the bit line Bitn, and the node S_000 on the source line SL. The gate of the N channel MOS transistor is coupled to the word line WL_000

Here, a program contactor is present between the N channel MOS transistor TR-A and the node S_000 on the source line SL. Thus, when the N channel MOS transistor TR-A is ON, the voltage on the source line SL is transmitted to the bit line Bit through the N channel MOS transistor TR-A.

On the other hand, there is no program contactor between the N channel MOS transistor TR-B and the node S_000 on the source line SL. Thus, when the N channel MOS transistor TR-B is ON, the voltage on the source line SL is not transmitted to the bit line Bitn through the N channel MOS transistor TR-B.

The memory cell CL_xxx includes N channel MOS transistors TR-1 and TR-2. The N channel MOS transistor TR-1 is provided between a node N1_xxx on the bit line Bit and a node S_xxx on the source line SL. The gate of the N channel MOS transistor TR-1 is coupled to the word line WL_xxx. The N channel MOS transistor TR-2 is provided between a node N2_xxx on the bit line Bitn, and the node S_xxx on the source line SL. The gate of the N channel MOS transistor TR-2 is coupled to the word line WL_xxx.

Here, a program contactor is present between the N channel MOS transistor TR-1 and the node S_xxx on the source line SL. Thus, when the N channel MOS transistor TR-1 is ON, the voltage on the source line SL is transmitted to the bit line Bit through the N channel MOS transistor TR-1.

On the other hand, there is no program contactor between the N channel MOS transistor TR-2 and the node S_xxx on the source line SL. Thus, when the N channel MOS transistor TR-2 is ON, the voltage on the source line SL is not transmitted to the bit line Bitn through the N channel MOS transistor TR-2.

The memory cell CL_yyy includes N channel MOS transistors TR-C and TR-D. The N channel MOS transistor TR-C is provided between a node N1_yyy on the bit line Bit and a node S_yyy on the source line SL. The gate of the N channel MOS transistor TR-C is coupled to a word line WL_yyy. The N channel MOS transistor TR-D is provided between a node N2_yyy on the bit line Bitn and the node S_yyy on the source line SL. The gate of the N channel MOS transistor TR-D is coupled to the word line WL_yyy.

Here, there is no program contactor between the N channel MOS transistor TR-C and the node S_yyy on the source line SL. Thus, when the N channel MOS transistor TR-C is ON, the voltage on the source line SL is not transmitted to the bit line Bit through the N channel MOS transistor TR-C.

On the other hand, there is a program contactor between the N channel MOS transistor TR-D and the node S_yyy on the source line SL. Thus, when the N channel MOS transistor TR-D is ON, the voltage on the source line is transmitted to the bit line Bitn through the N channel MOS transistor TR-D.

A precharge circuit 50 is used to set the bit line pair to a constant potential in advance before word line activation. The precharge circuit 50 includes P channel MOS transistors TR-3, TR-4, and TR-5. The P channel MOS transistor TR-3 is provided between the power supply vdd and a node ND1 on the bit line Bit. The gate of the P channel MOS transistor TR-3 receives a precharge signal PC. The P channel MOS transistor TR4 is provided between the power supply vdd and a node ND2 on the bit line Bitn. The gate of the P channel MOS transistor TR4 receives the precharge signal PC. The P channel MOS transistor TR-5 is provided between the node ND1 on the bit line Bit and the node ND2 on the bit line Bitn. The gate of the P channel MOS transistor TR5 receives the precharge signal PC.

A column selector 58 includes P channel MOS transistors TR-6 and TR-7. The P channel MOS transistor TR-6 is provided between a node N1_yyy and a node ND3 on the bit line Bit. The P channel MOS transistor TR-6 is provided between a node N2_yyy and a node ND4 on the bit line Bitn.

The gates of the P channel MOS transistors TR-6 and TR-7 receive a column selection signal C_SEL<i>.

The gate of the P channel MOS transistors TR-6 and the gate of the P channel MOS transistor TR-7 receive the column selection signal C_SEL<i>.

The differential sense amplifier 10 amplifies the potential difference between the voltage of the node ND3 on the bit line Bit and the voltage of the node ND4 on the bit line Bitn.

A logic circuit 245 is coupled to the bit line pair Bit, Bitn.

The logic circuit 245 includes inverters IV1 and IV2, and an exclusive OR circuit EOR.

The inverter IV1 is coupled to the node ND3 on the bit line Bit, and receives the voltage of the bit line Bit. The inverter IV2 is coupled to the node ND4 on the bit line Bitn, and receives the voltage of the bit line Bitn. The inverters IV1 and IV2 have the same characteristics with the same threshold voltage.

Here, the column selector 58 includes the P channel MOS transistors TR-6 and TR-7, so that the inputs of the inverters IV1, IV2 are only reduced to a value smaller by the threshold voltage P_Vth of the P channel MOS transistors TR-6 and TR7 from the precharge level (vdd level). For this reason, the threshold voltage of the inverters IV1 and IV2 is set to higher than vdd/2. Note that when the column selector 58 is formed by CMOS transistors, the threshold voltage of the inverters IV1 and IV2 can be set to vdd/2.

The exclusive OR circuit EOR outputs a latch signal QT that represents the exclusive OR of the output of the inverter IV1 and the output of the inverter IV2.

A multiplexer MUX receives the output signal QT of the exclusive OR circuit EOR, and an output signal QN of the differential sense amplifier 10. The multiplexer MUX outputs the signal QT when a test signal Test is activated to "H" level. The multiplexer MUX outputs the signal QN when the test signal Test is inactivated to "L" level.

Figure 7:
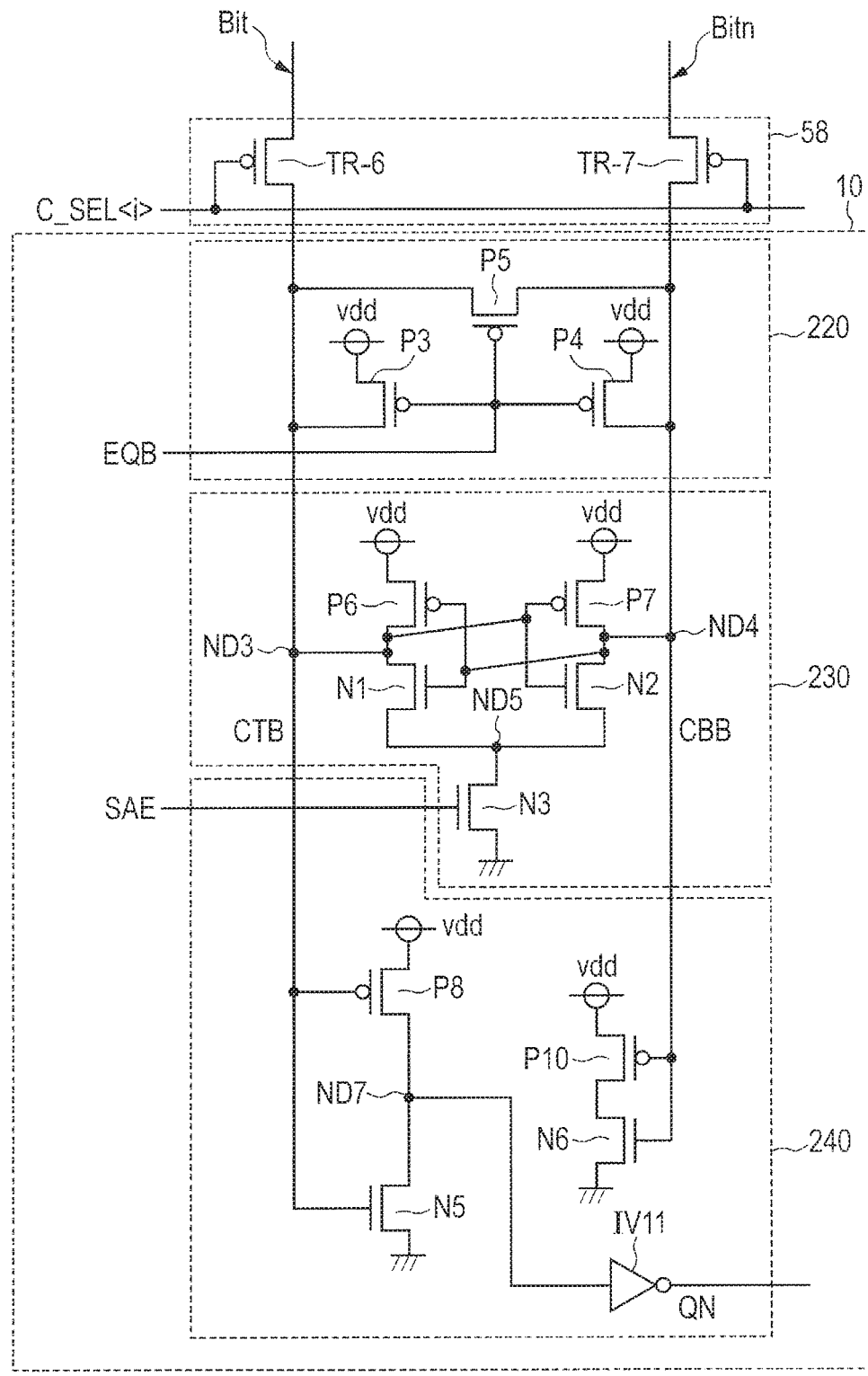
FIG. 7 is a diagram showing the configuration of a differential sense amplifier.

FIG. 7 is a diagram showing the configuration of the differential sense amplifier 10 in the i-th column.

The differential sense amplifier 10 includes a precharge and equalizing part 220, an amplifying part 230, and a buffer part 240.

The precharge and equalizing part 220 includes: a P channel MOS transistor P3 for coupling a data read line CTB and the power supply voltage vdd; a P channel MOS transistor P4 for coupling a data read line CBB and the power supply voltage vdd; and a P channel MOS transistor P5 for coupling the data read lines CTB and CBB. The gates of the P channel MOS transistors P3, P4 and P5 receive an equalization signal EQB. Note that the equalization signal EQB, not shown, is generated by the control logic circuit 108.

The amplifying part 230 includes P channel MOS transistors P-6, P-7, and N channel MOS transistors N1, N2, and M3.

The P channel MOS transistor P6 is provided between the power supply voltage vdd and the node ND3 of the data read line CTB. The N channel MOS transistor N1 is provided between the node ND3 of the data read line CTB and a node ND5. The P cannel MOS transistor P-7 is provided between the power supply voltage vdd and the node ND4 of the data read line CBB. The N channel MOS transistor N2 is provided between the node ND4 of the data read line CBB and the node ND5. The N channel MOS transistor N3 is provided between the node ND5 and the ground GND.

The gate of the P channel MOS transistor P6 and the gate of the N channel MOS transistor N1 are coupled to a node ND6. The gate of the P channel MOS transistor P7 and the gate of the N channel MOS transistor N2 are coupled to a node ND9. The gate of the N channel MOS transistor N3 receives a sense amplifier activation signal SAE. When the sense amplifier activation signal SAE is activated to "H" level, the amplifying part 230 performs an amplifying operation.

The buffer part 240 includes an inverter IV11, P channel MOS transistors P8, P10, and N channel MOS transistors N5, N6.

Note that, the sense amplifier activation signal SAE, not shown, is generated by the control logic circuit 108.

The P channel MOS transistor P8 is provided between the power supply voltage vdd and a node ND7.

The N channel MOS transistor N5 is provided between the ground GND and the node ND7.

The gate of the P channel MOS transistor P8 and the gate of the N channel MOS transistor N5 are coupled to the data read line CTB.

The P channel MOS transistor P10 and the N channel MOS transistor N6 are provided between the power supply voltage vdd and the ground GND. The gate of the P channel MOS transistor P10 and the gate of the N channel MOS transistor N6 are coupled to the data read line CBB.

The inverter IV11 receives the voltage of the node ND7 and outputs the latch signal QN.

Figure 8:
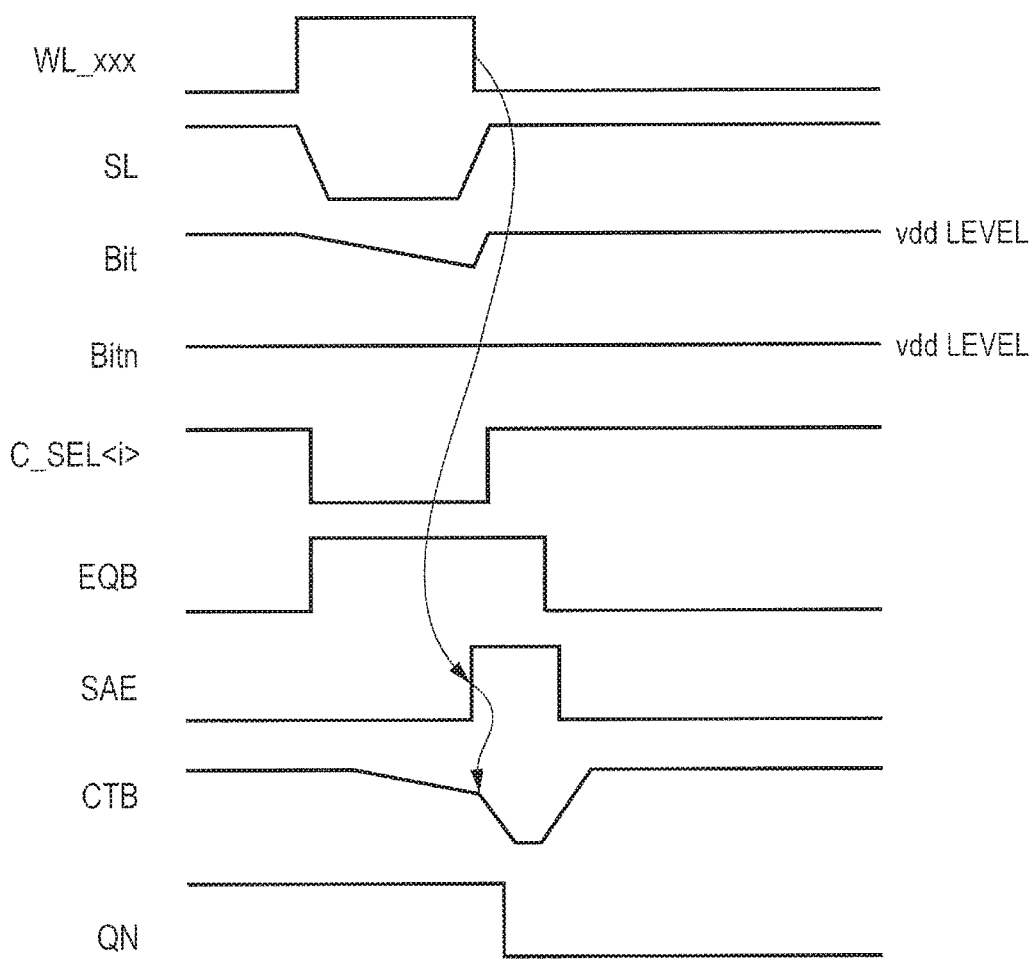
FIG. 8 is a diagram that illustrates the operation of the differential sense amplifier.

FIG. 8 is a diagram that illustrates the operation of the differential sense amplifier.

Here, the operation will be described by focusing on the memory cell CL_xxx of FIG. 6.

When the word line WL_xxx is activated and the source line SL is coupled to the ground GND, the potential of the bit line Bit is reduced, and the potential of the bit line Bitn maintains the precharge level (vdd level).

At this time, the column selection signal C_SEL<i> falls to "L" level, and the equalization signal EQB rises to "H" level. In this way, the P channel MOS transistors P1 and P2 are turned on. Then, the bit line Bit is coupled to the data read line CTB, and the bit line Bitn is coupled to the data read line CBB. Further, precharge and equalization of the data read lines CBT and CBB by the P channel MOS transistors P3, P4, and P5 are completed.

At the time when the activation of the word line WL is completed, the sense amplifier activation signal SAE is activated. In this way, the amplifying operation by the amplifying part 230 is started. Then, the voltage of the data read line CTB is reduced to "L" level. As a result, the latch signal QN is changed to "L" level.

(Operation in the Normal Mode)

Figure 9:
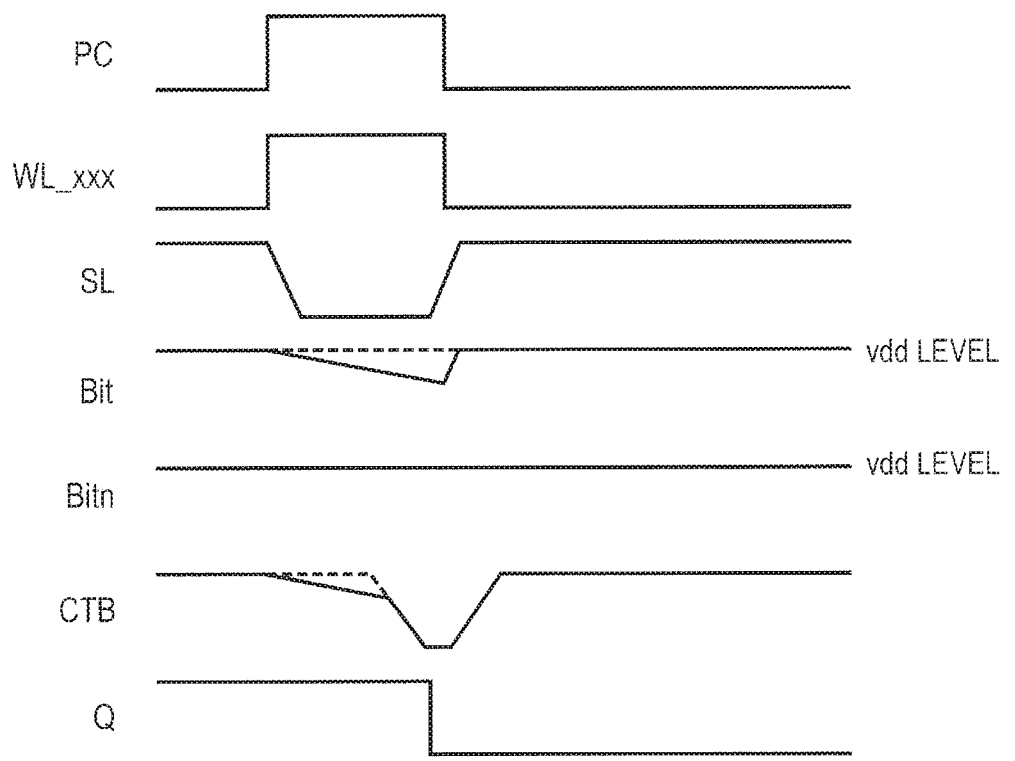
FIG. 9 is a diagram showing the time variation of the signals generated in the normal mode according to the second embodiment.

FIG. 9 is a diagram showing the time variation of the signals generated in the normal mode according to the second embodiment.

Here, the description will focus on the memory cell CL_xxx of FIG. 6, and explain the read operation of the memory cell CL_xxx in the normal mode.

Although not shown, the test signal Test is changed to "L" level by the control logic circuit 108 in the normal mode.

First, when the precharge signal PC is at "L" level, the P channel MOS transistors TR-3, TR-4 and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off. As a result, the voltage of the source line SL is not transmitted to the bit lines Bit and Bitn.

Next, the precharge signal PC rises to "H" level, and at the same time the word line WL_xxx rises to "H" level. Then, the source line SL is coupled to the ground GND by the switch 161. Here, the precharge circuit+CSL driver group 105 and the row decoder 103 activate the precharge signal PC and the word line WL_xxx, respectively, based on the clock CLKB. Thus, in the normal mode, during the period in which the precharge signal PC and the word line WL_xxx are activated, the pulse width of the clock CLKB is that in the normal mode as shown in FIG. 4, which is shorter than the pulse width of the clock CLKB in the test mode.

When the precharge signal PC rises to "H" level, the P channel MOS transistors TR-3, TR-4, and TR-5 are turned off. Further, when the word line WL_xxx rises to "H" level, the N channel MOS transistors TR-A and TR-B are turned on.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source line SL, so that the voltage on the source line SL is not transmitted to the bit line Bitn through the N channel MOS transistor TR-2. As a result, the voltage of the bit line Bitn maintains the precharge level (vdd level).

The differential sense amplifier 10 amplifies a small difference in potential between the bit line Bit and the bit line Bitn. As a result, the voltage of the data read line CTB is reduced to "L" level. At the same time, although not shown, the latch signal QN is changed to "L" level.

The test signal Test is changed to "L" level in the normal mode, so that the multiplexer MUX supplies the latch signal QN output from the differential sense amplifier 10, to an output latch 11.

The output latch 11 receives the latch signal QN of "L" level, and outputs an output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 9, the voltage of the bit line Bit maintains the precharge level (vdd level).

If the differential sense amplifier 10 has an offset that makes it easy to sense with the bit line Bit at "L" level due to the state of the finished differential sense amplifier 10, the voltage of the data read line CTB is reduced to "L" level. At the same time, although not shown, the latch signal QN is changed to "L" level. As a result, similarly to the case in which there is no defect in the production, the output signal Q from the output latch 11 is changed to "L" level. For this reason, the semiconductor device will pass the shipping test if the product does not have the test mode described below.

However, both the N channel MOS transistors TR-1 and TR-2 are not coupled to the source line SL and may be easily affected by the noise in actual operation in the market. As a result, the output signal Q from the output latch is unstable and may even be at "H" level, so that there is a risk of malfunction.

(Operation in the Test Mode)

Figure 10:
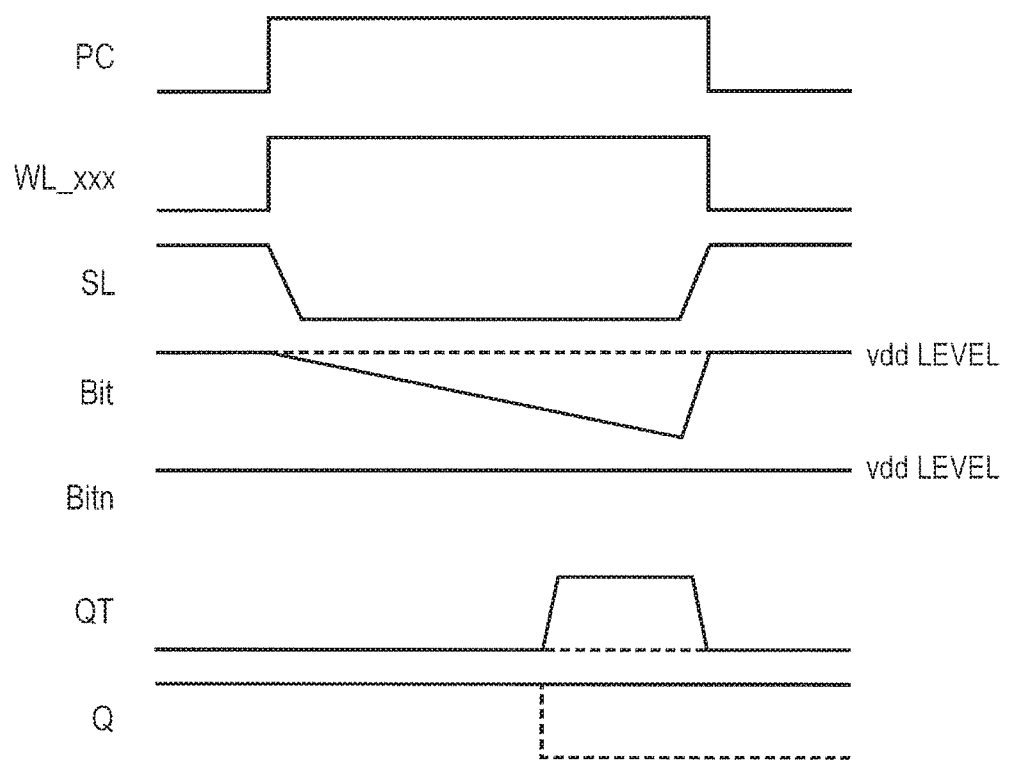
FIG. 10 is a diagram showing the time variation of the signals generated in the test mode according to the second embodiment.

FIG. 10 is a diagram showing the time variation of the signals generated in the test mode according to the second embodiment.

Here, the description will focus on the memory cell CL_xxx of FIG. 6, and explain the detection of abnormality in the program of the memory cell CL_xxx in the test mode.

Although not shown, in the test mode, the test signal Test is changed to "H" level by the control logic circuit 108.

First, when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off. Then, the voltage of the source line SL is not transmitted to the bit lines Bit and Bitn.

Next, the precharge signal PC rises to "H" level, and at the same time the word line WL_xxx rises to "H" level. Then, the source line SL is coupled to the ground GND by the switch 161.

Here, the precharge circuit+CSL driver group 105 and the row decoder 103 activate the precharge signal PC and the word line WL_xxx, respectively, based on the clock CLKB. Thus, in the test mode, during the period in which the precharge signal PC and the word line WL_xxx are activated, the pulse width of the clock CLKB is that in the test mode as shown in FIG. 5, which is longer than the pulse width of the clock CLKB in the normal mode.

When the precharge signal PC rises to "H" level, the P channel MOS transistors TR-3, TR-4, and TR-5 are turned off. Further, when the word line WL_xxx rises to "H" level, the N channel MOS transistors TR-A and TR-B are turned on.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source line SL, so that the voltage on the source line SL is not transmitted to the bit line Bitn through the N channel MOS transistor TR-2. As a result, the voltage of the bit line Bitn maintains the precharge level (vdd level).

Also in the test mode, the differential sense amplifier 10 amplifies a small difference in potential between the bit line Bit and the bit line Bitn. However, the differential sense amplifier 10 may be stopped in the test mode.

The inverter IV1 outputs "H" level when the voltage of the bit line Bit is reduced to below the threshold voltage of the inverter IV1. Or to put it the other way around, in the present embodiment, the row decoder 103 is required to activate the word line WL_xxx during the period until the voltage of the bit line Bit is reduced to below the threshold voltage of the inverter IV1.

On the other hand, the voltage of the bit line Bitn maintains the precharge level (vdd level), so that the output of the inverter IV2 maintains "L" level.

The exclusive OR circuit EOR outputs "H", which is the exclusive OR of the output of the inverter IV1 and the output of the inverter IV2, as the latch signal QT.

In the test mode, the test signal Test is changed to "H" level, so that the multiplexer MUX supplies the latch signal QT of "H" level output from the exclusive OR circuit EOR, to the output latch 11.

The output latch 11 receives the latch signal QT of "H" level and outputs the output signal Q of "H" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line of FIG. 10, the voltage of the bit line Bit maintains the precharge level (vdd level).

The output of the inverter IV1 maintains "L" level because the voltage of the bit line Bit is at the precharge level (vdd level). As a result, the latch signal QT output from the exclusive OR circuit EOR is changed to "L" level. Further, the latch signal QT output from the multiplexer MUX is changed to "L" level. Then, the output signal Q output from the output latch 11 is changed to "L" level.

By recognizing the fact that the output signal Q whose level is different from the level (expected value) in the normal condition is output from the output latch 11, it is possible to understand that the product is not normally programmed because the connection between the N channel MOS transistor TR-1 and the source line SL is broken due to a defect in the production.

As described above, according to the present embodiment, the level of the voltage of the bit line pair is determined by using the inverters in the test mode. In this way, it is possible to prevent the results from being affected by the offset voltage of the differential sense amplifier, and thus to increase the accuracy of the test.

Further, in the present embodiment, the expected value in the test mode is "1" for all addresses and does not depend on the program code, so that the built-in self-test (BIST) can be facilitated.

Further, in the present embodiment, only two inverters, the exclusive OR circuit, and the multiplexer are added, so that the overhead of the circuit is small.

Note that in the present embodiment, the voltage of the bit line pair Bit, Bitn is sensed by using the inverter. However, it is also possible to directly sense the voltage of the bit line pair Bit, Bitn by using the exclusive OR circuit or the NAND circuit.

Third Embodiment

Figure 11:
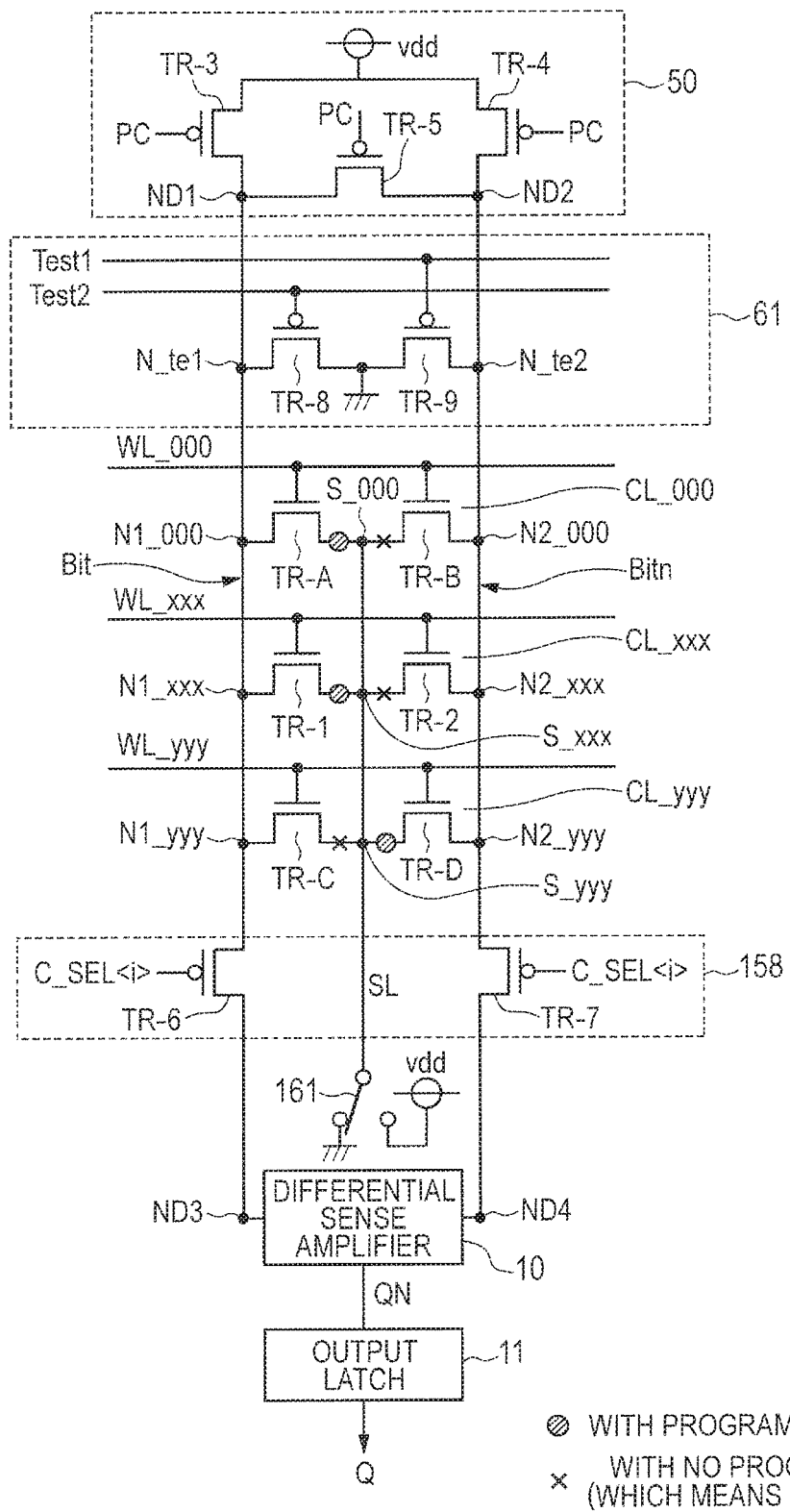
FIG. 11 is a diagram showing a part of the configuration of the memory array and the I/O circuit in the i-th column according to a third embodiment.

FIG. 11 is a diagram showing a part of the configuration of the memory array 104 and the I/O circuit 107 in the i-th column according to a third embodiment.

The configuration of FIG. 11 is different from the configuration of FIG. 6 in the following point.

The configuration of FIG. 11 includes a voltage fixing circuit (voltage control circuit) 61, in place of including the inverters IV1, IV2 and the exclusive OR circuit EOR.

The voltage fixing circuit 61 fixes the bit line Bit or Bitn at a voltage higher than the voltage of the ground GND and lower than the precharge voltage (vdd).

The voltage fixing circuit 61 includes P channel MOS transistors TR-8 and TR-9.

The P channel MOS transistor TR-8 is provided between a node N_te1 on the bit line Bit and the ground GND. The gate of the P channel MOS transistor TR-8 receives the test signal Test2.

The P channel MOS transistor TR-9 is provided between a node N_te2 on the bit line Bitn and the ground GND. The gate of the P channel MOS transistor TR-9 receives the test signal Test1.

The output latch 11 receives the output signal QN from the differential sense amplifier 10. Then, the output latch 11 latches the output signal QN and outputs to the outside as the output signal Q.

(Operation in the Normal Mode)

The time variation of the signals generated in the normal mode in the present embodiment is the same as that in the second embodiment shown in FIG. 9. Thus, the time variation of the signals generated in the normal mode in the present embodiment will be described with reference to FIG. 9.

Here, the description will focus on the memory cell CL_xxx and explain the read operation of the memory cell CL_xxx in the normal mode.

Although not shown, in the normal mode, the test signals Test1 and Test 2 are changed to "H" level by the control logic circuit 108.

First, when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off. As a result, the voltage of the source line SL is not transmitted to the bit lines Bit and Bitn.

Next, the precharge signal PC rises to "H" level, and at the same time the word line WL_xxx rises to "H" level. Then, the source line SL is coupled to the ground GND by the switch 161. Here, the precharge circuit+CSL driver group 105 and the row decoder 103 activate the precharge signal PC and the word line WL_xxx, respectively, based on the clock CLKB. Thus, in the normal mode, during the period in which the precharge signal PC and the word line WL_xxx are activated, the pulse width of the clock CLKB is that in the normal mode as shown in FIG. 4, which is shorter than the pulse width of the CLKB in the test mode.

In the normal mode, the test signals Test1 and Test2 are at "H" level, so that the P channel MOS transistors TR-8 and TR-9 maintain their off state. Thus, the voltage of the ground GND is not transmitted to the bit line Bit through the P channel MOS transistor TR-8. Also, the voltage of the ground GND is not transmitted to the bit line Bitn through the P channel MOS transistor TR-9.

When the precharge signal PC rises to "H" level, the P channel MOS transistors TR-3, TR-4, and TR-5 are turned off. Further, when the word line WL_xxx rises to "H" level, the N channel MOS transistors TR-1 and TR-2 are turned on.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source SL, so that the voltage on the source SL is not transmitted to the bit line Bitn through the N channel MOS transistor TR-2. As a result, the voltage of the bit line Bitn maintains the precharge level (vdd level).

The differential sense amplifier 10 amplifies a small difference in potential between the bit line Bit and the bit line Bitn. As a result, the voltage of the data read line CTB is reduced to "L" level. At the same time, although not shown, the latch signal QN is changed to "H" level.

In response to the latch signal QN of "H" level, the output latch 11 outputs the output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 9, the voltage of the bit line Bit maintains the precharge level (vdd level).

If the differential sense amplifier 10 has an offset that makes it easy to sense with the bit line Bit at "L" level due to the state of the finished differential sense amplifier 10, the voltage of the data read line CTB is reduced to "L" level. At the same time, although not shown, the latch signal QN is changed to "H" level. As a result, similarly to the case in which there is no defect in the production, the output signal Q from the output latch 11 is changed to "L" level. Consequently, the semiconductor device will pass the shipping test if the product does not have the test mode described below.

However, both the N channel MOS transistors TR-1 and TR-2 are not coupled to the source line SL, and may be easily affected by the noise in actual operation in the market. As a result, the output signal Q from the output latch 11 is unstable and may even be at "H" level, which may result in a risk of malfunction.

(Operation of the First Phase in the Test Mode)

The first phase is the period to detect non-conduction of the program on the side of the bit line Bit. In other words, the first phase detects if there is an abnormality in the contact hole coupling one of the two transistors included in the memory cell that is coupled to the bit line Bit, and the source line SL.

Figure 12:
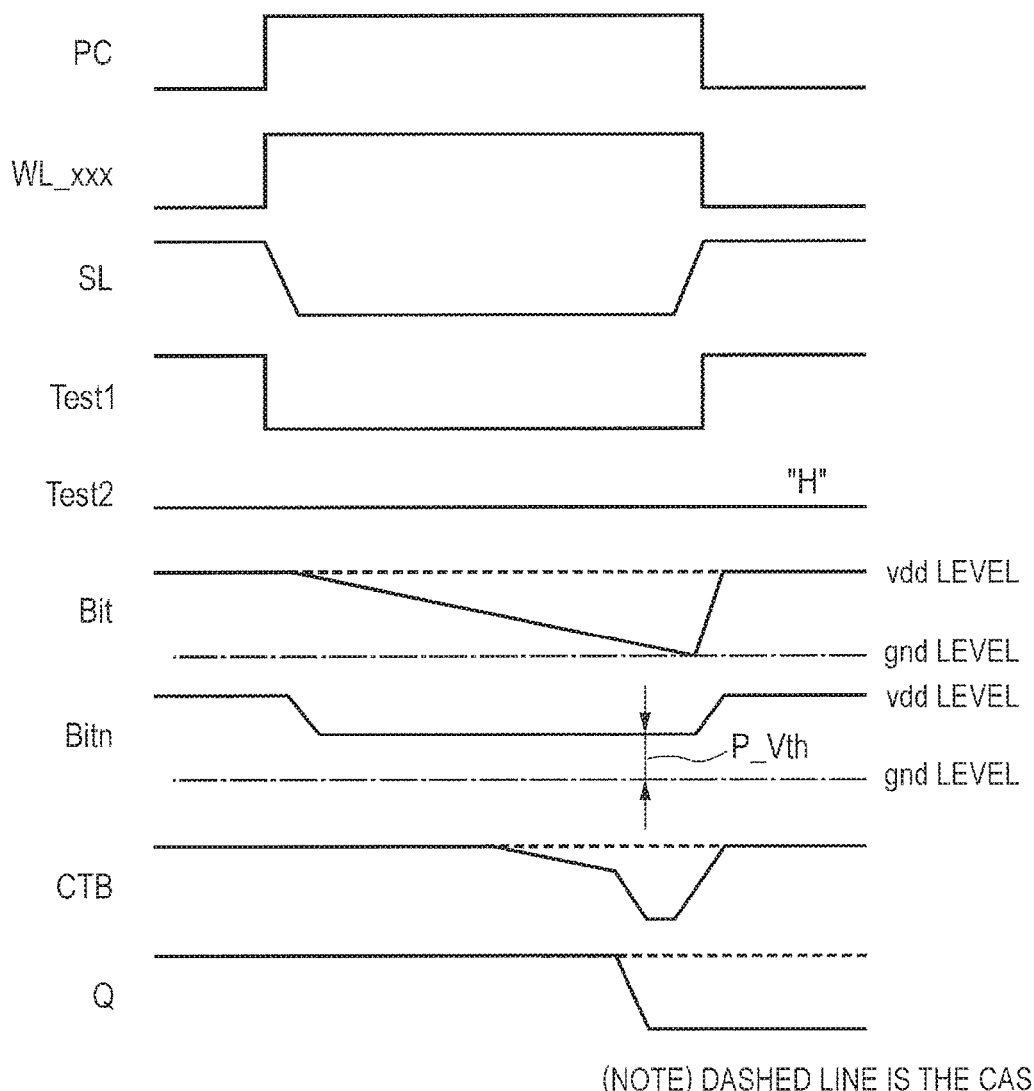
FIG. 12 is a diagram showing the time variation of the signals generated in the first phase of the test mode according to the third embodiment.

FIG. 12 is a diagram showing the time variation of the signals generated in the first phase in the test mode according to the third embodiment.

Here, the description will focus on the memory cell CL_xxx of FIG. 11, and explain the detection of an abnormality in the program of the memory cell CL_xxx in the test mode.

First, when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off, so that the voltage of the source line SL is not transmitted to the bit lines Bit and Bitn.

Next, the precharge signal PC rises to "H" level, and at the same time, the word line WL_xxx rises to "H" level. Then, the source line SL is coupled to the ground GND by the switch 161.

Here, the precharge circuit+CSL driver group 105 and the row decoder 103 activate the precharge signal PC and the word line WL_xxx, respectively, based on the clock CLKB. Thus, in the test mode, during the period in which the precharge signal PC and the word line WL_xxx are activated, the pulse width of the clock CLKB is that in the test mode as shown in FIG. 5, which is longer than the pulse width of the clock CLKB in the normal mode.

Further, the test signal Test1 falls to "L" level by the control logic circuit 108. The test signal Test2 is maintained at "H" level.

When the precharge signal PC rises to "H" level, the P channel MOS transistors TR-3, TR-4, and TR-5 are turned off. Further, when the word line WL_xxx rises to "H" level, the N channel MOS transistors TR-1 and TR-2 are turned on.

Since the test signal Test1 is at "L" level, the P channel MOS transistor TR-9 is brought into the on state. Then, the voltage of the ground GND is transmitted to the bit line Bitn through the P channel MOS transistor TR-9. The voltage of the bit line Bitn is reduced from the ground (gnd) level to a voltage higher by the threshold voltage P_Vth of the P channel MOS transistor TR-9. The voltage P_Vth is a value greater than the offset voltage of the differential sense amplifier 10. Note that the test signal Test2 is constantly maintained at "H" level.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source line SL, so that the voltage on the source line SL is not transmitted to the bit line Bitn through the N channel MOS transistor TR-2. Thus, the voltage of the bit line Bitn maintains the voltage higher by the threshold voltage P_Vth of the P channel MOS transistor TR-9 from the gnd level.

The differential sense amplifier 10 amplifies a small difference in potential between the bit line Bit and the bit line Bitn. As a result, the voltage of the data read line TB is reduced to "L" level. At the same time, although not shown, the latch signal QN is changed to "L" level.

In response to the latch signal QN of "L" level, the output latch 11 outputs the output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 12, the voltage of the bit line Bit maintains the precharge level (vdd level).

The differential sense amplifier 10 amplifies a small difference in potential between the bit line Bit and the bit line Bitn. As a result, the voltage of the data read line CTB maintains "H" level. At the same time, although not shown, the latch signal QN is changed to "H" level.

In response to the latch signal QN of "H" level, the output latch 11 outputs the output signal Q of "H" level.

By recognizing the fact that the output signal Q whose level is different from the level (expected value) in the normal condition is output from the output latch 11, it is possible to understand that the product is not normally programmed because the connection between the N channel MOS transistor TR-1 and the source line SL is broken due to a defect in the production.

(Operation of the Second Phase in the Test Mode)

The second phase is the period to detect non-conduction of the program on the side of the bit line Bitn. In other words, the second phase detects if there is an abnormality in the contact hole coupling one of the two transistors included in the memory cell that is coupled to the bit line Bitn, and the source line SL.

Figure 13:
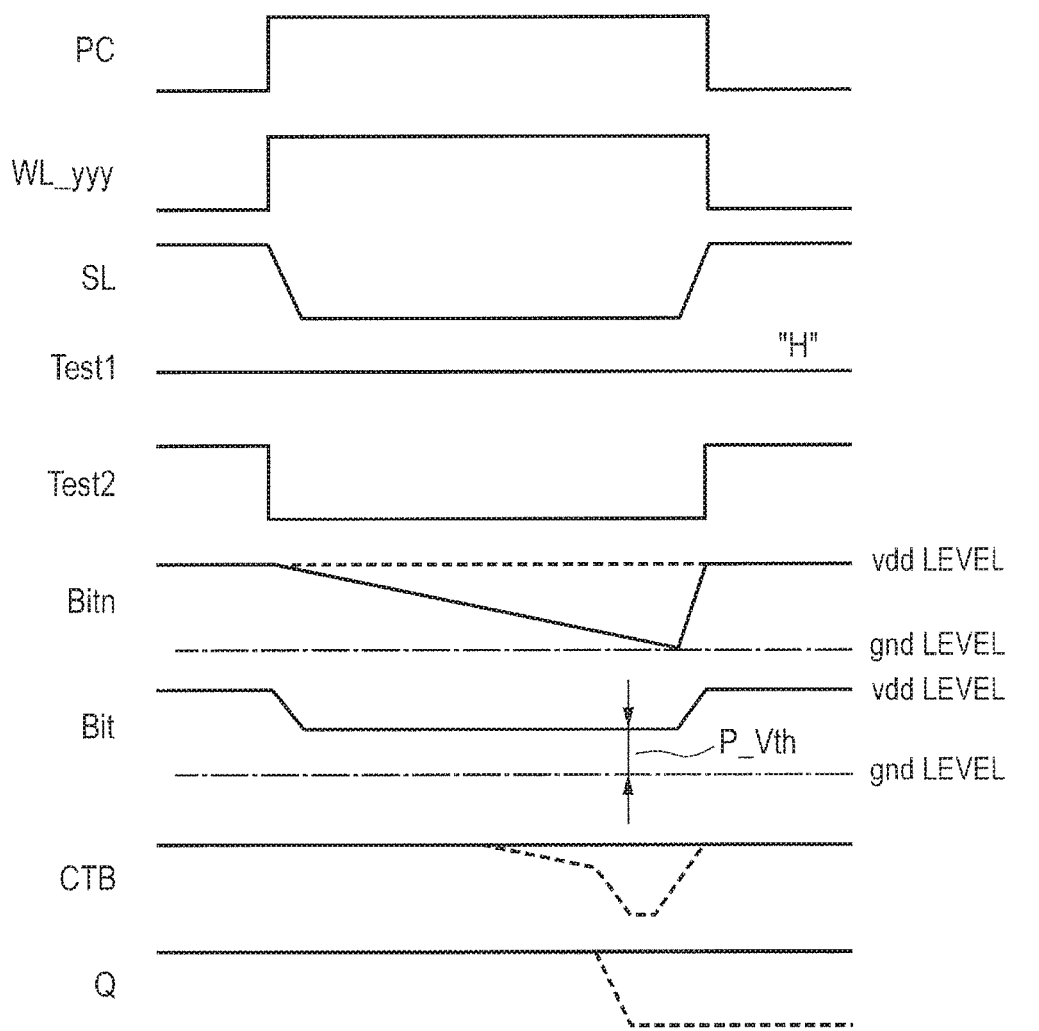
FIG. 13 is a diagram showing the time variation of the signals generated in the second phase of the test mode according to the third embodiment.

FIG. 13 is a diagram showing the time variation of the signals generated in the second phase in the test mode according to the third embodiment.

Here, the description will focus on the memory cell CL_yyy of FIG. 11, and explain the detection of an abnormality in the program of the memory cell CL_yyy in the test mode.

First, when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_yyy is inactive (at "L" level), the N channel MOS transistors TR-C and TR-D are turned off. As a result, the voltage of the source line SL is not transmitted to the bit lines Bit and Bitn.

Next, the precharge signal PC rises to "H" level, and at the same time the word line WL_yyy rises to "H" level. Then, the source line SL is coupled to the ground GND by the switch 161.

Here, the precharge circuit+CSL driver group 105 and the row decoder 103 activate the precharge signal PC and the word line WL_yyy, respectively, based on the clock CLKB. Thus, in the test mode, during the period in which the precharge signal PC and the word line WL_yyy are activated, the pulse width of the clock CLKB is that in the test mode as shown in FIG. 5, which is longer than the pulse width of the clock CLKB in the normal mode.

Further, the test signal Test2 falls to "L" level by the control logic circuit 108. The test signal Test1 is maintained at "H" level.

When the precharge signal PC rises to "H" level, the P channel MOS transistors TR-3, TR-4, and TR-5 are turned off. Further, when the word line WL_yyy rises to "H" level, the N channel MOS transistors TR-C and TR-D are turned on.

Since the test signal Test 2 is at "L" level, the P channel MOS transistor TR-8 is brought into the on state. As a result, the voltage of the ground GND is transmitted to the bit line Bit through the P channel MOS transistor TR-8. Then, the voltage of the bit line Bit is changed to the voltage higher by the threshold voltage P_Vth of the P channel MOS transistor TR-9 from the gnd level. Note that the test signal Test1 is constantly maintained at "H" level.

When the connection between the N channel MOS transistor TR-D and the source line SL is not broken, the voltage of the ground GND on the source line SL is transmitted to the bit line Bitn through the N channel MOS transistor TR-D. In this way, the voltage of the bit line Bitn is reduced.

On the other hand, there is no program contactor between the N channel MOS transistor TR-C and the node S_yyy on the source line SL, so that the voltage on the source line SL is not transmitted to the bit line Bit through the N channel MOS transistor TR-C. As a result, the voltage of the bit line Bit maintains the voltage higher by the threshold voltage P_Vih of the P channel MOS transistor TR-9 from the gnd level.

The differential sense amplifier 10 amplifies a small difference in potential between the bit line Bit and the bit line Bitn. As a result, the voltage of the data read line CTB is maintains at "H" level. At the same time, although not shown, the latch signal QN is changed to "H" level.

In response to the latch signal QN of "H" level, the output latch 11 outputs the output signal Q of "H" level.

Here, when the connection between the N channel MOS transistor TR-D and the source line SL is broken due to a defect in the production, the voltage of the ground GND on the source line SL is not transmitted to the bit line Bit through the N channel MOS transistor TR-D. As a result, as shown by the dashed line in FIG. 13, the voltage of the bit line Bitn maintains the precharge level (vdd level).

The differential sense amplifier 10 amplifies a small difference in potential between the bit line Bit and the bit line Bitn. As a result, the voltage of the data read line CTB is reduced to "L" level. At the same time, although not shown, the latch signal QN is changed to "L" level.

In response to the latch signal QN of "L" level, the output latch 11 outputs the output signal Q of "L" level.

By recognizing the fact that the output signal Q whose level is different from the level (expected value) in the normal condition is output from the output latch 11, it is possible to understand that the product is not normally programmed because the connection between the N channel MOS transistor TR-D and the source line SL is broken due to a defect in the production.

As described above, according to the present embodiment, the bit line whose level is not determined is fixed at an intermediate potential in the test mode, in order to prevent the results from being affected by the offset voltage of the differential sense amplifier. Thus, it is possible to increase the accuracy of the test.

Further, in the present embodiment, only the voltage fixing circuit is added, so that the overhead of the circuit area is small.

Fourth Embodiment

Figure 14:
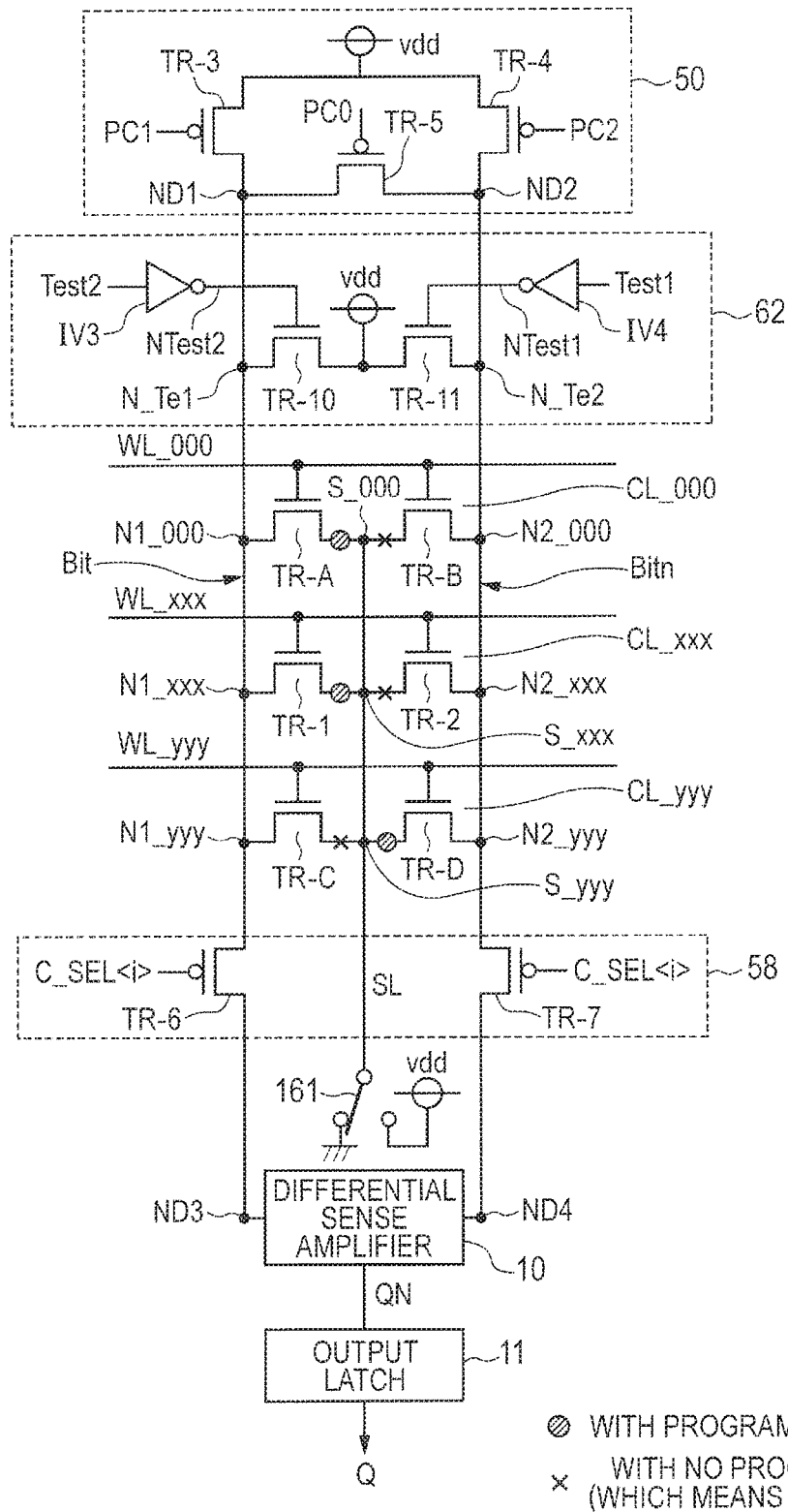
FIG. 14 is a diagram showing a part of the configuration of the memory array and the I/O circuit in the i-th column according to a fourth embodiment.

FIG. 14 is a diagram showing a part of the configuration of the memory array 104 and the I/O circuit 107 in the i-th column according to a fourth embodiment.

The configuration of FIG. 14 is different from the configuration of FIG. 6 in the following point.

The configuration of FIG. 14 includes a voltage fixing circuit (voltage control circuit) 62, in place of including the inverters IV1, IV2 and the exclusive OR circuit EOR.

The voltage fixing circuit 62 fixes the bit line Bit or Bitn at a voltage higher than the voltage of the ground GND and lower than the precharge voltage (vdd).

The voltage fixing circuit 62 includes inverters IV3, IV4, and P channel MOS transistors TR-10, TR-11.

The inverter IV3 inverts the test signal Test2 and outputs a signal NTest2.

The P channel MOS transistor TR-10 is provided between a node N_te1 on the bit line Bit and the power supply vdd. The gate of the P channel MOS transistor TR-10 receives the signal NTest2.

The inverter IV4 inverts the test signal Test1 and outputs a signal NTest1.

The P channel MOS transistor TR-11 is provided between a node N_te2 on the bit line Bitn and the power supply vdd. The gate of the P channel MOS transistor TR-11 receives the signal NTest1.

The output latch 11 receives the output signal QN from the differential sense amplifier 10. Then, the output latch 11 latches the output signal QN and outputs to the outside as the output signal Q.

(Operation in the Normal Mode)

The time variation of the signals generated in the normal mode in the present embodiment is the same as the time variation in the second embodiment shown in FIG. 9. Thus, the time variation of the signals generated in the normal mode in the present embodiment will be described with reference to FIG. 9.

Here, the description will focus on the memory cell CL_xxx and explain the read operation of the memory cell CL_xxx in the normal mode.

Although not shown, the test signals Test1 and Test2 are changed to "H" level by the control logic circuit 108 in the normal mode.

First, when precharge signals PC0, PC1, and PC2 are at "L" level, the P channel MOS transistors TR-3, TR-4, and TR-5 are turned on. Then, the voltage of the bit lines Bit and Bitn are changed to the precharge level (vdd level).

Further, when the word line WL_xxx is inactive (at "L" level), the N channel MOS transistors TR-1 and TR-2 are turned off, so that the voltage of the source line SL is not transmitted to the bit lines Bit and Bitn.

Next, the precharge signals PC0, PC1, and PC2 rise to "H" level, and at the same time the word line WL_xxx rises to "H" level. Then, the source line SL is coupled to the ground GND by the switch 161.

Here, the precharge circuit+CSL driver group 105 and the row decoder 103 activate the precharge signal PC and the word line WL_xxx, respectively, based on the clock CLKB. Thus, in the normal mode, during the period in which the precharge signal PC and the word line WL_xxx are activated, the pulse width of the clock CLKB is that in the normal mode as shown in FIG. 4, which is shorter than the pulse width of the clock CLKB in the test mode.

In the normal mode, the test signals Test1 and Test2 are at "H" level, so that the N channel MOS transistors TR-10 and TR-11 maintain their off state. Thus, the power supply voltage vdd is not transmitted to the bit line Bit through the N channel MOS transistor TR-10. Further, the power supply voltage vdd is not transmitted to the bit line Bitn through the N channel MOS transistor TR-11.

When the precharge signals PC0, PC1, and PC2 rise to "H" level, the P channel MOS transistors TR-3, TR-4, and TR-5 are turned off. Since the P channel MOS transistor TR-5 is turned off, the bit lines Bit and Bitn are not equalized.

Further, when the work line WL_xxx rises to "H" level, the N channel MOS transistors TR-1 and TR-2 are turned on.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source SL, so that the voltage on the source line SL is not transmitted to the bit line Bitn through the N channel MOS transistor TR-2. As a result, the voltage of the bit line Bitn maintains the precharge level (vdd level).

The differential sense amplifier 10 amplifies a small difference in potential between the bit line Bit and the bit line Bitn. As a result, the voltage of the data read line CTB is reduced to "L" level. At the same time, although not shown, the latch signal QN is changed to "L" level.

In response to the latch signal QN of "L" level, the output latch 11 outputs the output signal of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 9, the voltage of the bit line Bit maintains "H" level (vdd level).

If the differential sense amplifier 10 has an offset that makes it easy to sense with the bit line Bit at "L" level due to the state of the finished differential sense amplifier 10, the voltage of the data read line CTB is reduced to "L" level. At the same time, although not shown, the latch signal QN is changed to "H" level. As a result, similarly to the case in which there is no defect in the production, the output signal Q from the output latch 11 is changed to "L" level. Consequently, the semiconductor device will pass the shipping test if the product does not have the test mode described below.

However, both the N channel MOS transistors TR-1 and TR-2 are not coupled to the source line SL, and may be easily affected by the noise in actual operation in the market. As a result, the output signal Q from the output latch 11 is unstable and may even be at "H" level, so that there is a risk of malfunction.

(Operation of the First Phase in the Test Mode)

The first phase is the period to detect non-conduction of the program on the side of the bit line Bit. In other words, the first phase detects if there is an abnormality in the contact hole coupling one of the two transistors included in the memory cell that is coupled to the bit line Bit, and the source line SL.

Figure 15:
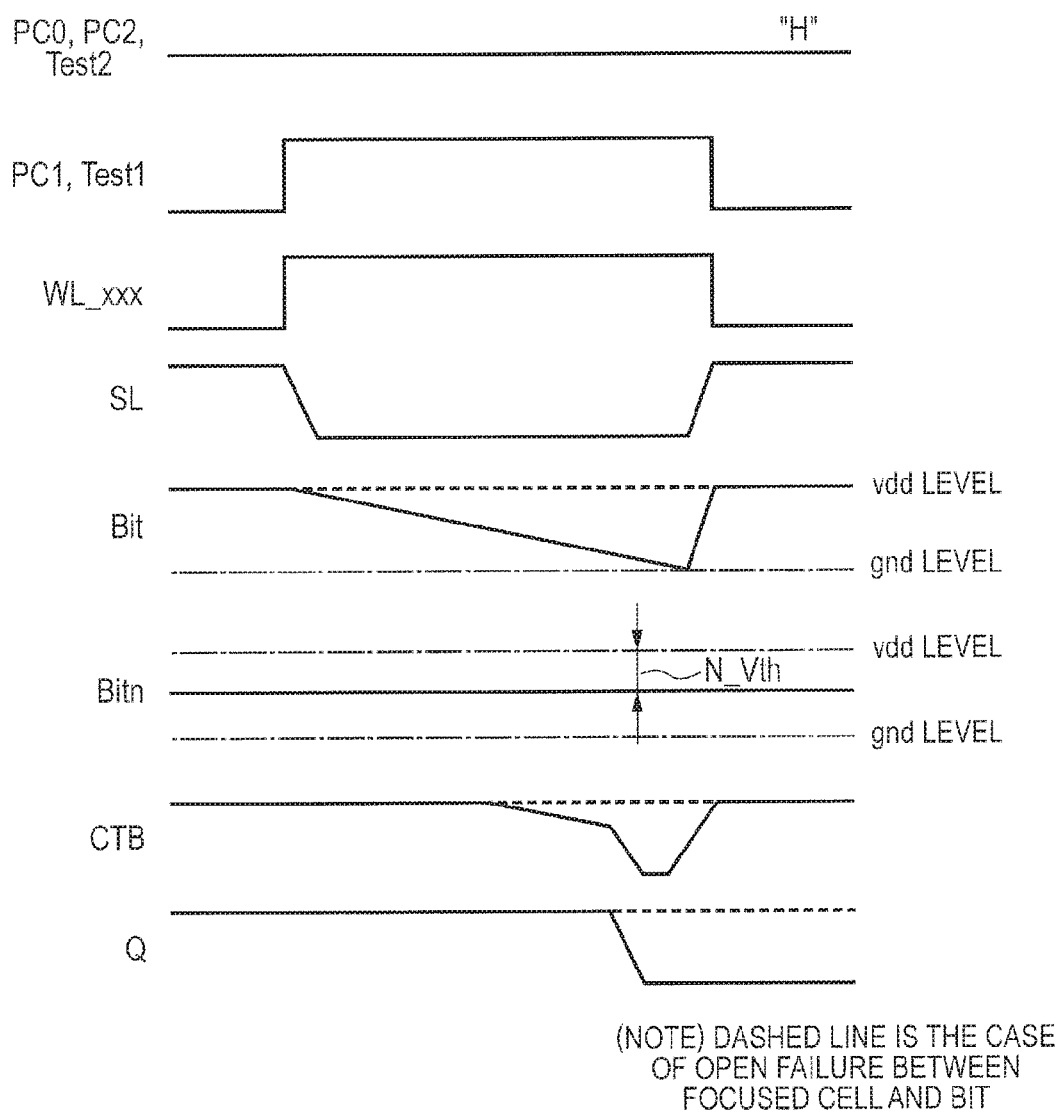
FIG. 15 is a diagram showing the time variation of the signals generated in the first phase of the test mode according to the fourth embodiment.

FIG. 15 is a diagram showing the time variation of the signals generated in the first phase in the test mode according to the fourth embodiment.

Here, the description will focus on the memory cell CL_xxx in FIG. 14 and explain the detection of an abnormality in the program of the memory cell CL_xxx in the test mode.

In the initial state, the precharge signals PC0 and PC2, as well as the test signal Test2 are changed to "H" level. Further, the precharge signal PC1 and the test signal Test1 are changed to "L" level. Then, the word line WL_xxx is brought into the inactive state (at "L" level).

At this time, the P channel MOS transistors TR-4 and TR-5 are turned off, the P channel MOS transistor TR-3 is turned on, the N channel MOS transistor TR-10 is turned off, and the N channel MOS transistor TR-11 is turned on.

As a result, the voltage of the bit line Bit is changed to the precharge level (vdd level). Further, the voltage of the bit line Bitn is changed to the voltage which is lower by the threshold voltage N Vth of the N channel MOS transistor TR-11 from the precharge level (vdd level). The voltage N_Vth is the value greater than the offset voltage of the differential sense amplifier 10.

Further, at this time, the N channel MOS transistors TR-1 and TR-2 are turned off.

As a result, the voltage of the source line SL is not transmitted to the bit lines Bit and Bitn.

Next, the precharge circuit+CSL driver group 105 and the row decoder 103 activate the precharge signal PC1 and the word line WL_xxx, respectively, based on the clock CLKB. Thus, in the test mode, during the period in which the precharge signal PC1 and the word line WL_xxx are activated, the pulse width of the clock CLKB is that in the test mode as shown in FIG. 5, which is longer than the pulse width of the clock CLKB in the normal mode.

Further, the source line SL is coupled to the ground GND by the switch 161. Then, the test signal Test1 rises to "H" level by the control logic circuit 108.

Since the precharge signal PC1 rises to "H" level, the P channel MOS transistor TR-3 is turned off. Further, the test signal Test1 rises to "H", so that the N channel MOS transistor TR-11 is turned off.

As a result, when the connection between the N channel MOS transistor TR-1 and the source line SL is not broken, the voltage of the ground GND on the source SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source line SL, so that the voltage on the source line SL is not transmitted to the bit line Bitn through the N channel MOS transistor TR-2. As a result, the voltage of the bit line Bitn maintains the voltage which is lower by N_Vth from the precharge level (vdd level).

The differential sense amplifier 10 amplifies a small difference in potential between the bit line Bit and the bit line Bitn. As a result, although not shown, the voltage of the data read line CTB is reduced to "L" level, and at the same time, the latch signal QN is changed to "L" level.

In response to the latch signal QN of "L" level, the output latch 11 outputs the output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 15, the voltage of the bit line Bit maintains the precharge level (vdd level).

The differential sense amplifier 10 amplifies a small difference in potential between the bit line Bit and the bit line Bitn. As a result, the voltage of the data read line CTB maintains the precharge level (vdd level) and the latch signal QN is changed to "H" level.

In response to the latch signal QN of "H" level, the output latch 11 outputs the output signal Q of "H" level.

By recognizing the fact that the output signal Q whose level is different from the level (expected value) in the normal condition is output from the output latch 11, it is possible to understand that the product is not normally programmed because the connection between the N channel MOS transistor TR-1 and the source line SL is broken due to a defect in the production.

(Operation of the Second Phase in the Test Mode)

The second phase is the period to detect non-conduction of the program on the side of the bit line Bitn. In other words, the second phase detects if there is an abnormality in the contact hole coupling one of the two transistors included in the memory cell that is coupled to the bit line Bitn, and the source line SL.

Figure 16:
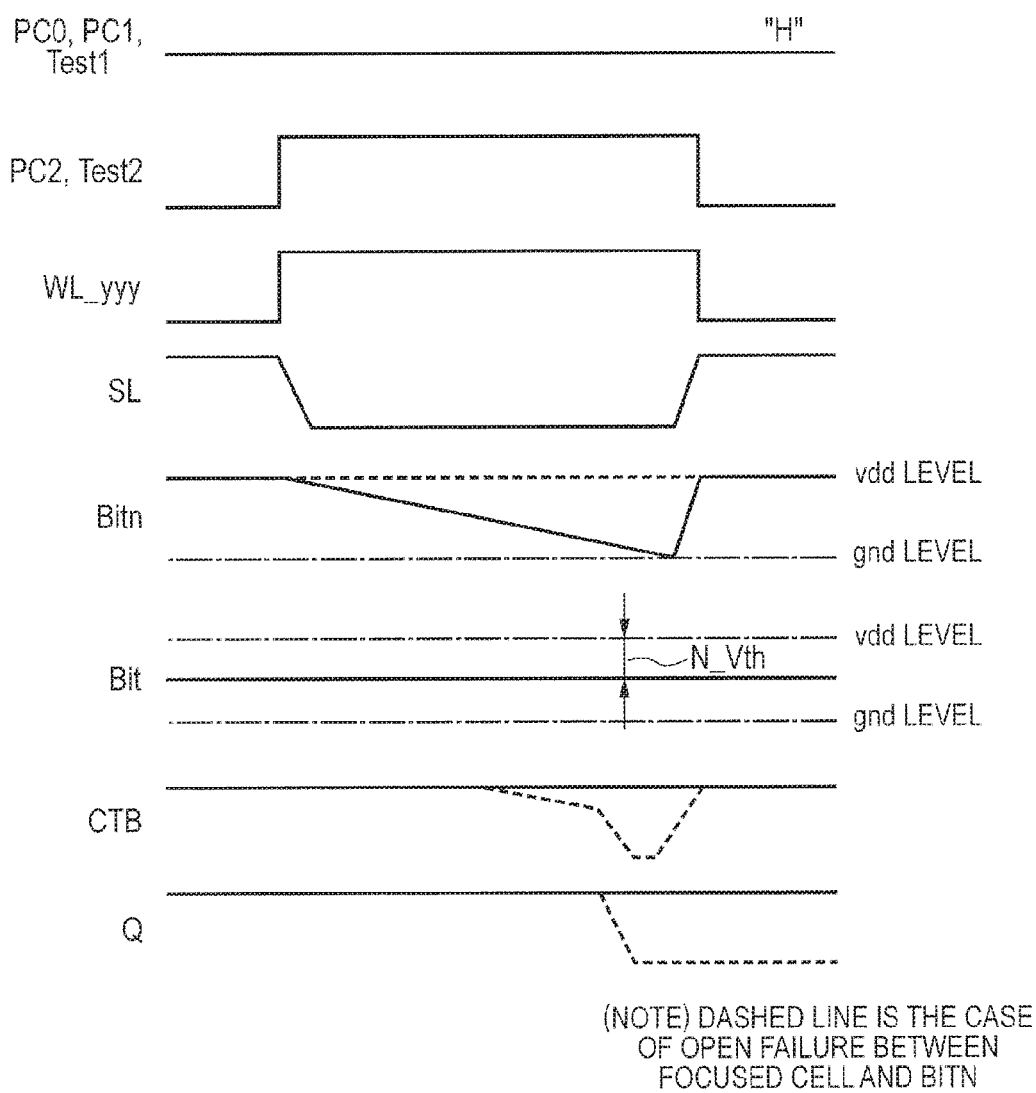
FIG. 16 is a diagram showing the time variation of the signals generated in the second phase of the test mode according to the fourth embodiment.

FIG. 16 is a diagram showing the time variation of the signals generated in the second phase in the test mode according to the fourth embodiment.

Here, the description will focus on the memory cell CL_yyy and explain the detection of an abnormality in the program of the memory cell CL_yyy in the test mode.

In the initial state, the precharge signals PC0, PC1, and the test signal Test1 are at "H" level, the precharge signal PC2 and the test signal Test2 are at "L" level, and the word line WL_yyy is inactive (at "L" level).

At this time, the P channel MOS transistors TR-3 and TR-5 are turned off, the P channel MOS transistor TR-4 is turned on, the N channel MOS transistor TR-11 is turned off, and the N channel MOS transistor TR-10 is turned on.

As a result, the voltage of the bit line Bitn is at the precharge level (vdd level). Further, the voltage of the bit line Bit is changed to the voltage, which is lower by the threshold voltage N_Vth of the N channel MOS transistor TR-10, from the precharge level (vdd level). The voltage N_Vth is the value greater than the offset voltage of the differential sense amplifier 10.

Further, the N channel MOS transistors TR-C and TR-D are turned off at this time.

As a result, the voltage of the source line SL is not transmitted to the bit lines Bit and Bitn.

Next, the precharge circuit+CSL driver group 105 and the row decoder 103 activate the precharge signal PC2 and the word line WL_yyy, respectively, based on the clock CLKB. Thus, in the test mode, during the period in which the precharge signal PC2 and the word line WL_yyy are activated, the pulse width of the clock CLKB is that in the test mode as shown in FIG. 5, which is longer than the pulse width of the clock CLKB in the normal mode.

Further, the source line SL is coupled to the ground GND by the switch 161, and then the test signal Test2 rises to "H" level by the control logic circuit 108.

The precharge signal PC2 rises to "H" level, so that the P channel MOS transistor TR-4 is turned off. Further, since the test signal Test2 rises to "H" level, the N channel MOS transistor TR-10 is turned off.

As a result, when the connection between the N channel MOS transistor TR-D and the source line SL is not broken, the voltage of the ground GND on the source line SL is transmitted to the bit line Bitn through the N channel MOS transistor TR-D. In this way, the voltage of the bit line Bitn is reduced.

On the other hand, there is no program contactor between the N channel MOS transistor TR-C and the node S_xxx on the source line SL, so that the voltage on the source line SL is not transmitted to the bit line Bit through the N channel MOS transistor TR-C. Thus, the voltage of the bit line Bit maintains the voltage which is lower by N Vth from the precharge level (vdd level).

The differential sense amplifier 10 amplifies a small difference in potential between the bit line Bit and the bit line Bitn. As a result, the voltage of the data read line CTB maintains "H" level, and at the same time the latch signal QN is changed to "H" level.

In response to the latch signal QN of "H" level, the output latch 11 outputs the output signal of "H" level.

Here, when the connection between the N channel MOS transistor TR-D and the source line SL is broken due to a defect in the production, the voltage of the ground GND on the source line SL is not transmitted to the bit line Bitn through the N channel MOS transistor TR-D. As a result, as shown by the dashed line in FIG. 16, the voltage of the bit line Bitn maintains the precharge level (vddlevel).

The differential sense amplifier 10 amplifies a small difference in potential between the bit line Bit and the bit line Bitn. As a result, the voltage of the data read line CTB is reduced to "L" level, and the latch signal QN is changed to "L" level.

In response to the latch signal QN of "L" level, the output latch 11 outputs the output signal Q of "L" level.

By recognizing the fact that the output signal Q whose level is different from the level (expected value) in the normal condition is output from the output latch 11, it is possible to understand that the product is not normally programmed because the connection between the N channel MOS transistor TR-D and the source line SL is broken due to a defect in the production.

As described above, according to the present embodiment, similarly to the third embodiment, the bit line that is not subject to level determination is fixed at an intermediate potential in the test mode. In this way, it is possible to prevent the results from being affected by the offset voltage of the differential sense amplifier. Thus, it is possible to increase the accuracy of the test.

Further, in the present embodiment, only the voltage fixing circuit is added, so that the overhead of the circuit area is small.

Fifth Embodiment

Figure 17:
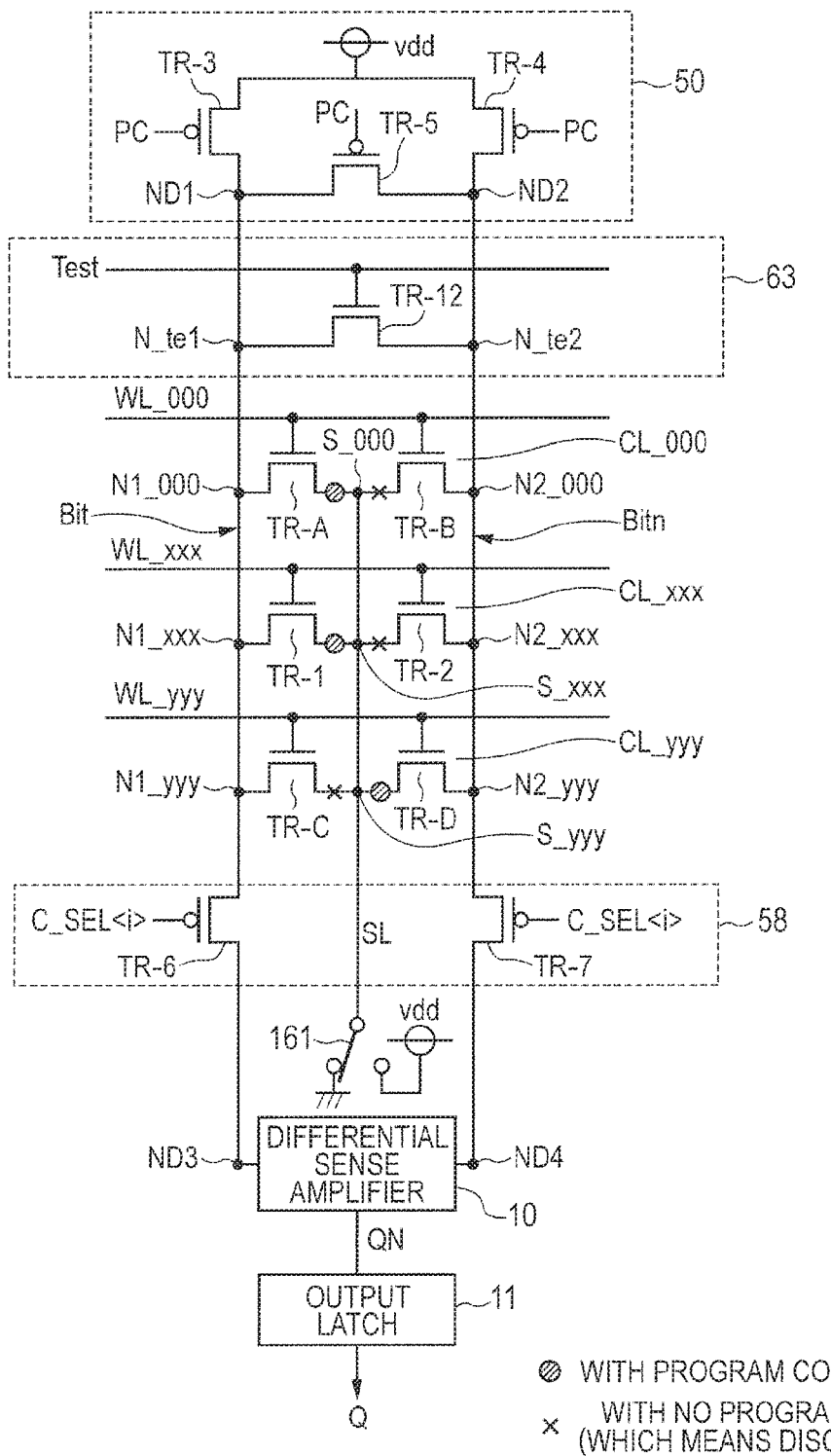
FIG. 17 is a diagram showing a part of the configuration of the memory array and the I/O circuit in the i-th column according to a fifth embodiment.

FIG. 17 is a diagram showing a part of the configuration of the memory array 104 and the I/O circuit 107 in the i-th column according to a fifth embodiment.

The configuration of FIG. 17 is different from the configuration of FIG. 6 in the following point.

The configuration of FIG. 17 includes a short-circuit circuit 63, in place of including the inverters IV1, IV2 and the exclusive OR circuit EOR.

The short-circuit circuit 63 short-circuits between the bit lines Bit and Bitn.

The short-circuit circuit 63 includes a P channel MOS transistor TR-12.

The P channel MOS transistor TR-12 is provided between the node N_te1 on the bit line Bit and the node N_te2 on the bit line Bitn. The gate of the P channel MOS transistor TR-12 receives the test signal Test.

The output latch 11 latches the output signal QN received from the differential sense amplifier 10, and outputs to the outside as the output signal Q.

(Operation in the Normal Mode)

The time variation of the signals generated in the normal mode according to the present embodiment is the same as that of the second embodiment shown in FIG. 9. Thus, the time variation of the signals generated in the normal mode according to the present embodiment will be described with reference to FIG. 9.

Here, the description will focus on the memory cell CL_xxx in FIG. 17 and explain the read operation of the memory cell CL_xxx in the normal mode.

Referring to FIG. 9, first when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off, so that the voltage of the source line SL is not transmitted to the bit lines Bit and Bitn.

Next, the precharge signal PC rises to "H" level, and at the same time the word line WL_xxx rises to "H" level. Then, the source line SL is coupled to the ground GND by the switch 161.

Here, the precharge circuit+CSL driver group 105 and the row decoder 103 activate the precharge signal PC and the word line WL_xxx. Thus, in the normal mode, during the period in which the precharge signal PC and the word line WL_xxx are activated, the pulse width of the clock CLKB is that in the normal mode as shown in FIG. 4, which is shorter than the pulse width of the clock CLKB in the test mode.

Since the test signal Test is at "L" level in the normal mode, the N channel MOS transistor TR-12 maintains the off state. For this reason, the bit lines Bit and Bitn are not coupled through the N channel MOS transistor TR-12.

When the precharge signal PC rises to "H" level, the P channel MOS transistors TR-3, TR-4, and TR-5 are turned off. Further, when the word line W_xxx rises to "H" level, the N channel MOS transistors TR-1 and TR-2 are turned on.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is reduced.

On the other hand, there is no program contactor between the N channel MOS transistor TR-2 and the node S_xxx on the source line SL, so that the voltage on the source line SL is not transmitted to the bit line Bitn through the N channel MOS transistor TR-2. As a result, the voltage of the bit line Bitn maintains the precharge level (vdd level).

The differential sense amplifier 10 amplifies a small difference in potential between the bit line Bit and the bit line Bitn. As a result, the voltage of the data read line CTB is reduced to "L" level. At the same time, although not shown, the latch signal QN is changed to "L" level.

In response to the latch signal QN of "L" level, the output latch 11 outputs the output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 9, the voltage of the bit line Bit maintains the precharge level (vdd level).

If the differential sense amplifier 10 has an offset that makes it easy to sense with the bit line Bit at "L" level due to the state of the finished differential sense amplifier 10, the voltage of the data read line CTB is reduced to "L" level. At the same time, although not shown, the latch signal QN is changed to "H" level. As a result, similarly to the case in which there is no defect in the production, the output signal Q from the output latch 11 is changed to "L" level. Consequently, the semiconductor device will pass the shipping test if the product does not have the test mode described below.

However, both the N channel MOS transistors TR-1 and TR-2 are not coupled to the source line SL, and may be easily affected by the noise in actual operation in the market. As a result, the output signal Q from the output latch 11 is unstable and may even be at "H" level, so that there is a risk of malfunction.

(Operation in the Test Mode)

Figure 18:
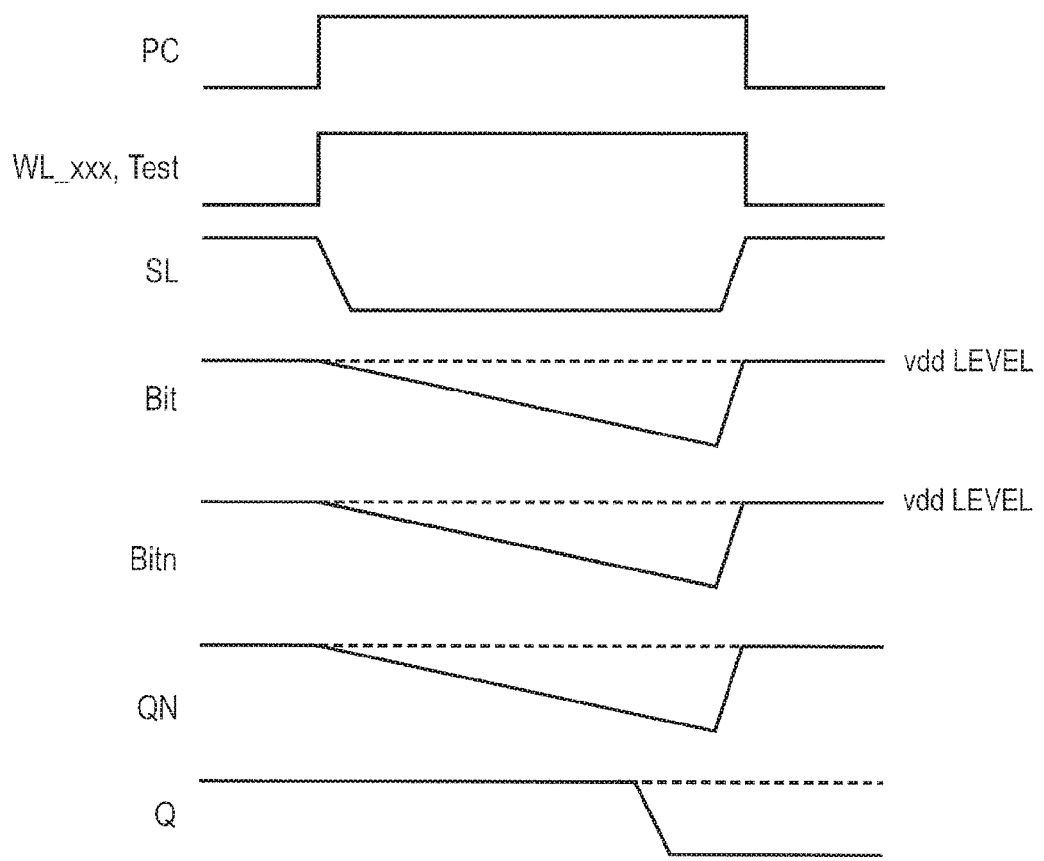
FIG. 18 is a diagram showing the time variation of the signals generated in the test mode according to the fifth embodiment.

FIG. 18 is a diagram showing the time variation of the signals generated in the test mode according to the fifth embodiment.

Here, the description will focus on the memory cell CL_xxx of FIG. 17 and explain the detection of an abnormality in the program of the memory cell CL_xxx in the test mode.

First, when the precharge signal PC is at "L" level, the P channel MOS transistors TR-3, TR-4, and TR-5 are turned on. Then, the voltages of the bit lines Bit and Bitn are changed to the precharge level (vdd level).

Further, when the word line WL_xxx is inactive (at "L" level), the N channel MOS transistors TR-1 and TR-2 are turned off. As a result, the voltage of the source line SL is not transmitted to the bit lines Bit and Bitn.

Next, the precharge signal PC rises to "H" level, and at the same time the word lineWL_xxx rises to "H" level. Then, the source line SL is coupled to the ground GND by the switch 161.

Here, the precharge circuit+CSL driver group 105 and the row decoder 103 activate the precharge signal PC and the word line WL_xxx, respectively, based on the clock CLKB. Thus, in the test mode, during the period in which the precharge signal PC and the word line WL_xxx are activated, the pulse width of the clock CLKB is that in the test mode as shown in FIG. 5, which is longer than the pulse width of the clock CLKB in the normal mode.

Further, in the test mode, the test signal Test1 is changed to "H" level by the control logic circuit 108.

When the precharge signal PC rises to "H" level, the P channel MOS transistors TR-3, TR-4, and TR-5 are turned off. Further, when the word line WL_xxx rises to "H" level, the N channel MOS transistors TR-1 and TR-2 are turned on.

Since the test signal Test is at "H" level, the N channel MOS transistor TR-12 is brought into the on state. Then, the bit lines Bit and Bitn are coupled through the N channel MOS transistor TR-12.

When the connection between the N channel MOS transistor TR-1 and the source line SL is not broken, the voltage of the ground GND on the source line SL is transmitted to the bit line Bit through the N channel MOS transistor TR-1. In this way, the voltage of the bit line Bit is gradually reduced.

On the other hand, there is no program contactor between the N channel MOS transistor TR-2 and the node S_xxx on the source line SL, the voltage on the source line SL is not transmitted to the bit line Bitn through the N channel MOS transistor TR-2. However, the N channel MOS transistor TR-12 is in the ON state, so that the voltage of the bit line Bit is transmitted to the bit line Bitn. As a result, the voltage of the bit line Bitn is gradually reduced similarly to the voltage of the bit line Bit.

At this time, in the present embodiment, the sense amplifier activation signal SAE is not activated to "H" level and the differential sense amplifier 10 is not started, which is different from the other embodiments. As a result, the voltage of the data read line CTB is reduced to "L" level, which is the voltage of the bit line Bit, and the latch signal QN is changed to "L" level.

In response to the latch signal QN of "L" level, the output latch 11 outputs the output signal Q of "L" level.

Here, when the connection between the N channel MOS transistor TR-1 and the source line SL is broken due to a defect in the production, the voltage of the ground GND on the source line SL is not transmitted to the bit line Bit through the N channel MOS transistor TR-1. As a result, as shown by the dashed line in FIG. 18, the voltage of the bit line Bit maintains the precharge level (vdd level). Further, since the N channel MOS transistor TR-12 is in the on state, the voltage of the bit line Bit is transmitted to the bit line Bitn. Thus, the voltage of the bit line Bitn maintains the precharge level (vdd level) similarly to the voltage of the bit line Bit. At this time, different from the other embodiments, in the present embodiment, the sense amplifier activation signal SAE is not activated to "H" level and the differential sense amplifier 10 is not started. As a result, the voltage of the data read line CTB maintains "H" level which is the voltage of the bit line Bit, and the latch signal QN is changed to "H" level.

In response to the latch signal QN of "H" level, the output latch 11 outputs the output signal Q of "H" level.

By recognizing the fact that the output signal Q whose level is different from the level (expected value) in the normal condition is output from the output latch 11, it is possible to understand that the product is not normally programmed because the connection between the N channel MOS transistor TR-1 and the source line SL is broken due to a defect in the production.

As described above, according to the present embodiment, it is possible to determine the level of the bit line pair by short-circuiting the bit line pair and not operating the differential sense amplifier, in order to prevent the results from being affected by the offset voltage of the differential sense amplifier. In this way, it is possible to increase the accuracy of the test.

Further, the expected value in the test mode does not depend on the program code, so that the built-in self-test (BIST) can be facilitated.

Further in the present embodiment, only the short-circuit circuit is added, so that the overhead of the circuit area is small.

Although the invention made by the present inventors has been specifically described based on the embodiments, the present invention is not limited to the specific embodiments, and it goes without saying that various changes and modifications can be made without departing from the scope of the present invention.

What is claimed is:

1. A semiconductor device comprising:
   a plurality of word lines;
   a first bit line and a second bit line;
   a plurality of memory cells coupled to the plurality of word lines and the first and second bit lines so that one memory cell is coupled to one word line and the first and a second bit lines;
   a differential sense amplifier coupled to the first and a second bit lines for amplifying the potential difference between the first and second bit lines;
   a peripheral circuit coupled to the first and a second bit lines; and an output latch coupled to the peripheral circuit for latching the output of the peripheral circuit,
wherein a logic circuit includes:
a first inverter coupled to the first bit line;
a second inverter coupled to the second bit line; and
an exclusive OR circuit for receiving an output of the first inverter and an output of the second inverter.

2. A semiconductor device according to claim 1,
wherein the peripheral circuit further includes a multiplexer,
wherein the multiplexer includes,
a first terminal for receiving an output of the differential sense amplifier; and
a second terminal for receiving an output of the logic circuit,
wherein the multiplexer selects the first or second terminal for outputting the output of the selected terminal as the output of the peripheral circuit.

3. A semiconductor device according to claim 2,
wherein the multiplexer receives a test signal,
wherein the multiplexer outputs the output of the first terminal to the output latch when the test signal inactivated to low level, and
wherein the multiplexer outputs the output of the second terminal to the output latch when the test signal is activated to high level.

4. A semiconductor device according to claim 2, further comprising a decoder for making the time for activing the word line when the multiplexer selects the first terminal, longer than the time for activating the word line when the multiplexer selects the second terminal.

5. A semiconductor device according to claim 4, wherein the word line is activated until the voltage of the first bit line is reduced to below the threshold voltage of the first inverter.

6. A semiconductor device according to claim 2, further comprising a precharge circuit coupled to the first and second bit lines, wherein
the precharge circuit includes:
a first MOS transistor coupled between the first bit line and a power supply node;
a second MOS transistor coupled between the second bit line and the power supply node; and
a third MOS transistor coupled between the first bit line and the second bit line.

7. A semiconductor device according to claim 6, further comprising a column selector coupled to the first and second bit lines; wherein
the column selector includes:
a fourth MOS transistor coupled to the first bit line; and
a fifth MOS transistor coupled to the second bit line.

8. A semiconductor device according to claim 2, wherein each of the memory cells incudes a sixth MOS transistor and a seventh MOS transistor,
a source line is coupled between the sixth MOS transistor and the seventh MOS transistor such that the sixth MOS transistor is disposed between the first bit line and the source line, and the seventh MOS transistor is disposed between the second bit line and the source line, and
the source line is coupled to a switch for connecting the source line to a power supply voltage or a ground voltage.

* * * * *